US008866171B2

(12) United States Patent
Nakamura et al.

(10) Patent No.: US 8,866,171 B2
(45) Date of Patent: Oct. 21, 2014

(54) LIGHT-EMITTING ELEMENT AND LIGHT-EMITTING DEVICE

(75) Inventors: Yasuo Nakamura, Tokyo (JP); Satoshi Seo, Kanagawa (JP); Masaaki Hiroki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 16 days.

(21) Appl. No.: 13/412,851

(22) Filed: Mar. 6, 2012

(65) Prior Publication Data

US 2012/0228657 A1    Sep. 13, 2012

(30) Foreign Application Priority Data

Mar. 7, 2011   (JP) .................. 2011-049386

(51) Int. Cl.
| | | |
|---|---|---|
| H01L 33/00 | (2010.01) | |
| H01L 23/52 | (2006.01) | |
| H01L 21/00 | (2006.01) | |
| H01L 21/82 | (2006.01) | |
| H01L 21/84 | (2006.01) | |
| H01L 21/44 | (2006.01) | |
| H01L 51/52 | (2006.01) | |
| H01L 27/32 | (2006.01) | |

(52) U.S. Cl.
CPC ......... *H01L 27/3225* (2013.01); *H01L 27/3244* (2013.01); *H01L 51/529* (2013.01); *H01L 27/3281* (2013.01); *H01L 2251/5361* (2013.01)
USPC   257/98; 257/209; 257/E51.002; 257/E33.062; 257/E33.063; 438/4; 438/22; 438/155; 438/132; 438/601

(58) Field of Classification Search
CPC ................. H01L 51/5221; H01L 2251/5338; C22C 12/00; C22C 28/00; C23C 14/12
USPC ................... 257/98, 209, E51.002, E51.019, 257/E33.062, E33.063; 438/4, 22, 155, 438/132, 601
See application file for complete search history.

(56) References Cited

U.S. PATENT DOCUMENTS

| | | | |
|---|---|---|---|
| 7,999,463 B2 | 8/2011 | Nomura | |
| 2003/0080677 A1* | 5/2003 | Mikhael et al. | ............... 313/504 |

(Continued)

FOREIGN PATENT DOCUMENTS

| | | |
|---|---|---|
| JP | 2006-108651 | 4/2006 |
| WO | WO 2008/117351 A1 | 10/2008 |

OTHER PUBLICATIONS

"Steel". Wikipedia. Retrieved Sep. 20, 2013 from: http://en.wikipedia.org/wiki/Steel.*

(Continued)

*Primary Examiner* — Julio J Maldonado
*Assistant Examiner* — Cory Eskridge
(74) *Attorney, Agent, or Firm* — Husch Blackwell LLP

(57) ABSTRACT

To provide a light-emitting element or a light-emitting device in which power is not consumed wastefully even if a short-circuit failure occurs. The present invention focuses on heat generated due to a short-circuit failure which occurs in a light-emitting element. A fusible alloy which is melted at temperature T2 by heat generated due to the short-circuit failure when the short-circuit failure occurs is used for at least one of a pair of electrodes in a light-emitting element, and a layer containing an organic composition which is melted at temperature T1 is formed on a surface of the electrode opposite to a surface facing the other electrode. The present inventors have reached a structure in which the temperature T2 is lower than temperature T3 at which the light-emitting element is damaged and the temperature T1 is lower than the temperature T2, and this structure can achieve the objects.

8 Claims, 10 Drawing Sheets

(56) References Cited

U.S. PATENT DOCUMENTS

| | | |
|---|---|---|
| 2004/0256980 A1* | 12/2004 | Tsuchiya .................. 313/503 |
| 2005/0147521 A1* | 7/2005 | Birnstock et al. ............. 420/555 |
| 2010/0096633 A1* | 4/2010 | Hatano et al. ................. 257/59 |
| 2011/0018434 A1* | 1/2011 | Miyaguchi ................... 313/512 |

OTHER PUBLICATIONS

Poly(methyl methacrylate), Wikipedia.*

Dow Epoxy Resins, table 3, p. 10, May 2007.*

* cited by examiner

LIGHT-EMITTING ELEMENT AND LIGHT-EMITTING DEVICE

BACKGROUND OF THE INVENTION

1. Field of the Invention

The present invention relates to a light-emitting element and a light-emitting device, and in particular, relates to a light-emitting element provided with a light-emitting thin film between a pair of electrodes and a light-emitting device including the light-emitting element.

2. Description of the Related Art

A light-emitting element in which a layer containing a light-emitting organic compound (also referred to as an EL layer) that spreads as a film is provided between a pair of electrodes has been known. Such a light-emitting element is called, for example, an organic EL element, and light emission can be obtained from a light-emitting organic compound when voltage is applied between a pair of electrodes. As examples of a light-emitting device including an organic EL element, a display device, and a planar lighting device can be given.

For example, a lighting device including an organic EL element is disclosed in Patent Document 1.

REFERENCE

Patent Document

[Patent Document 1] Japanese Published Patent Application No. 2006-108651

SUMMARY OF THE INVENTION

The thickness of an EL layer is as thin as approximately several tens to several hundreds of nanometers; therefore, there is a problem in that a short-circuit failure is likely to occur when a foreign substance enters between a pair of electrodes. Note that in this specification, the term "short-circuit failure" is not limited to the failure in the case where a pair of electrodes short-circuit regardless of voltage application and also includes the failure in the case where a pair of electrodes short-circuit as a result of voltage application (e.g., as a result of current concentration in a portion in which an EL layer is locally thin).

When a short circuit occurs between a pair of electrodes of an organic EL element, the organic EL element does not emit light, and in addition, power is consumed wastefully due to heat generation. Further, in the case where an adjacent organic EL element is provided, it may be damaged or deteriorate due to heat generated by the organic EL element where short circuit occurs.

In particular, when an organic EL element connected to a constant voltage supply is short-circuited, the organic EL element does not emit light, and in addition, heat generation may cause a fire. This is because a large amount of current is supplied from the constant voltage supply to the light-emitting element whose electric resistance becomes small due to short circuit.

The present invention is made in view of the foregoing technical background. Accordingly, it is an object of one embodiment of the present invention is to provide a light-emitting element in which power is not consumed wastefully even if a short-circuit failure occurs. It is another object of one embodiment of the present invention is to provide a light-emitting device in which power is not consumed wastefully by a light-emitting element in which a short-circuit failure occurs.

In order to achieve the above-described objects, the present invention focuses on heat generated due to a short-circuit failure which occurs in a light-emitting element. A fusible alloy which is melted at temperature T2 by heat generated due to the short-circuit failure when the short-circuit failure occurs is used for at least one of a pair of electrodes in a light-emitting element, and a layer containing an organic composition which is melted at temperature T1 is formed on a surface of the electrode opposite to a surface facing the other electrode. The present inventors have reached a structure in which the temperature T2 is lower than temperature T3 at which the light-emitting element is damaged and the temperature T1 is lower than the temperature T2, and this structure can achieve the objects. Note that in this specification, a state in which "a short-circuit failure occurs" refers to a state in which a short-circuit failure generates heat. Further, in this specification, a "melted" state refers to a state in which fluidity is exhibited by heat.

In other words, one embodiment of the present invention is a light-emitting element which includes an electrode containing a fusible alloy; an electrode which transmits visible light and faces one surface of the electrode containing the fusible alloy; a layer containing a light-emitting organic compound between the electrode containing the fusible alloy and the electrode which transmits visible light; and a layer containing an organic composition having thermal fusibility, which is in contact with the other surface of the electrode containing the fusible alloy, in which the melting point of the fusible alloy is higher than the melting point of the organic composition having thermal fusibility and lower than temperature at which the layer containing a light-emitting organic compound is damaged.

The light-emitting element according to one embodiment of the present invention includes the layer containing a light-emitting organic compound between the electrode containing the fusible alloy and the electrode which transmits visible light, and the electrode containing the fusible alloy is in contact with the layer containing the organic composition having thermal fusibility. In addition, the melting point of the fusible alloy is higher than the melting point of the organic composition having thermal fusibility and lower than temperature at which the layer containing a light-emitting organic compound is damaged.

Thus, before the layer containing a light-emitting organic compound is damaged by heat generated when a short-circuit failure in the light-emitting element occurs, the layer containing the organic composition having thermal fusibility is melted first, and then the electrode containing the fusible alloy is melted.

Since the surface tension of the electrode containing the fusible alloy is larger than that of the organic composition having thermal fusibility, the surface area of the electrode containing the fusible alloy shrinks when the fusible alloy is melted. Further, since the organic composition having thermal fusibility has been already melted to increase its fluidity, it can provide a space necessary to change the shape of the electrode containing the fusible alloy.

Next, the electrode containing the melted fusible alloy starts to shrink, and finally, a hole is formed in a portion where the temperature increases significantly due to a short-circuit failure. The formed hole has an effect of stopping power supply to a portion where a short-circuit failure occurs. The electrode containing the melted fusible alloy recedes from a region having high temperature where the electrode containing the melted fusible alloy flows easily to a solidified region having low temperature. Then, the layer containing a melted organic composition having thermal fusibility flows into the hole generated in the fusible alloy and fills the hole. Thus, a short-circuit failure is eliminated and the organic composition having thermal fusibility fills a portion where the electrode containing the fusible alloy recedes. As a result, a light-emitting element in which power is not consumed wastefully even if a short-circuit failure occurs can be provided. Further, a light-emitting element in which the layer containing a light-emitting organic compound is protected by the organic composition having thermal fusibility can be provided.

Further, one embodiment of the present invention is a light-emitting element which has the above structure and in which a thickness of the layer containing the organic composition having thermal fusibility is larger than that of the electrode containing the fusible alloy.

The light-emitting element according to one embodiment of the present invention has a structure in which the thickness of the layer containing the organic composition having thermal fusibility is larger than that of the electrode containing the fusible alloy. Thus, the organic composition having thermal fusibility, which is highly variable in shape by being melted to increase its fluidity, can provide an enough space for the shape of the electrode containing the fusible alloy to be changed. Further, the organic composition can cover a surface of the electrode containing the fusible alloy without interruption, so that the fusible alloy shrinks easily. Then, the electrode containing the melted fusible alloy recedes from a region having high temperature where the electrode containing the melted fusible alloy flows easily to a solidified region having low temperature. After that, the layer containing a melted organic composition having thermal fusibility flows into the hole generated in the fusible alloy and fills the hole. In such a manner, a short-circuit failure is eliminated and the organic composition having thermal fusibility fills the portion where the electrode containing the fusible alloy recedes. As a result, a light-emitting element in which power is not consumed wastefully even if a short-circuit failure occurs can be provided. Further, a light-emitting element in which the layer containing a light-emitting organic compound in a portion where a short-circuit failure occurs is protected by the organic composition having thermal fusibility can be provided.

Further, one embodiment of the present invention is the light-emitting element in which the melting point of the fusible alloy is lower than or equal to 200° C. and the melting point of the organic composition having thermal fusibility is higher than or equal to 100° C.

The light-emitting element according to one embodiment of the present invention has a structure in which the melting point of the fusible alloy is lower than or equal to 200° C. and the melting point of the organic composition having thermal fusibility is higher than or equal to 100° C. Thus, temperature which exceeds the glass transition temperature considerably can be prevented from continuing to be applied to the organic compound contained in the layer containing a light-emitting organic compound, which has an effect of preventing the layer containing a light-emitting organic compound from being damaged and an effect of protecting the layer containing a light-emitting organic compound because the organic composition having thermal fusibility becomes solidified in an usual usage environment. As a result, a light-emitting element in which power is not consumed wastefully even if a short-circuit failure occurs can be provided. Further, a light-emitting element in which the layer containing a light-emitting organic compound in the portion where a short-circuit failure occurs is protected by the organic composition having thermal fusibility can be provided.

Further, one embodiment of the present invention is the light-emitting element in which the fusible alloy contains one selected from bismuth (Bi), indium (In), lead (Pb), tin (Sn), and zinc (Zn), and its melting point is higher than 100° C. and lower than or equal to 200° C.

The light-emitting element according to one embodiment of the present invention includes the electrode containing the fusible alloy which contains one selected from bismuth (Bi), indium (In), lead (Pb), tin (Sn), and zinc (Zn) and the melting point of which is higher than 100° C. and less than or equal to 200° C. Thus, before the layer containing a light-emitting organic compound is damaged due to heat generated by a short-circuit failure which occurs, the electrode containing the fusible alloy is melted, so that a short-circuit failure is eliminated. As a result, a light-emitting element in which power is not consumed wastefully even if a short-circuit failure occurs can be provided.

Further, one embodiment of the present invention is the light-emitting element in which the organic composition having thermal fusibility contains one selected from rosin, wax, and a resin having thermal fusibility.

The light-emitting element according to one embodiment of the present invention has a structure in which an organic composition having thermal fusibility, which contains one selected from rosin, Paraffin wax, and an acrylic resin, is provided in contact with the electrode containing the fusible alloy. Thus, since the organic composition having lower surface tension can cover the surface of a fusible alloy without interruption, the melted fusible alloy moves easily and thus recedes from a region having high temperature where the electrode containing the melted fusible alloy flows easily to a solidified region having low temperature. After that, the layer containing the melted organic composition having thermal fusibility flows into the hole generated in the fusible alloy and fills the hole. Thus, a short-circuit failure is eliminated and the organic composition having thermal fusibility fills the portion where the electrode containing the fusible alloy recedes. As a result, a light-emitting element in which power is not consumed wastefully even if a short-circuit failure occurs can be provided. Further, a light-emitting element in which the layer containing a light-emitting organic compound in the portion where a short-circuit failure occurs is protected by the organic composition having thermal fusibility can be provided.

Further, one embodiment of the present invention is a light-emitting element which has the above structure and in which a charge generation layer is provided between the electrode containing the fusible alloy and the layer containing a light-emitting organic compound.

The light-emitting element according to one embodiment of the present invention has a structure in which a charge generation layer is provided between the electrode containing the fusible alloy and the layer containing a light-emitting organic compound. Thus, even when the work function of the fusible alloy is high, it is possible to provide a light-emitting element in which increase of driving voltage is suppressed and power is not consumed wastefully even if a short-circuit failure occurs. Further, it is possible to provide a light-emitting element in which increase of driving voltage is suppressed and the layer containing a light-emitting organic compound in the portion where a short-circuit failure occurs is protected by the organic composition having thermal fusibility.

Another embodiment of the present invention is a light-emitting device including the light-emitting element.

The light-emitting element described above is applied to the light-emitting device according to one embodiment of the present invention. Thus, a light-emitting device in which power is not consumed wastefully even if a short-circuit failure occurs can be provided.

Note that in this specification, an "EL layer" refers to a layer provided between a pair of electrodes in a light-emitting element. Thus, a light-emitting layer containing an organic compound that is a light-emitting substance which is interposed between electrodes is an embodiment of the EL layer.

Note that a light-emitting device in this specification means an image display device, a light-emitting device, or a light source (including a lighting device). In addition, the light-emitting device includes any of the following modules in its category: a module in which a connector such as an FPC (flexible printed circuit), a TAB (tape automated bonding) tape, or a TCP (tape carrier package) is attached to a light-emitting device; a module having a TAB tape or a TCP provided with a printed wiring board at the end thereof; and a module having an IC (integrated circuit) directly mounted over a substrate over which a light-emitting element is formed by a COG (chip on glass) method.

According to one embodiment of the present invention, a light-emitting element in which power is not consumed wastefully even if a short-circuit failure occurs can be provided. Further, a light-emitting device in which power is not consumed wastefully by a light-emitting element where a short-circuit failure occurs can be provided.

DETAILED DESCRIPTION OF THE INVENTION

Figure 1A:
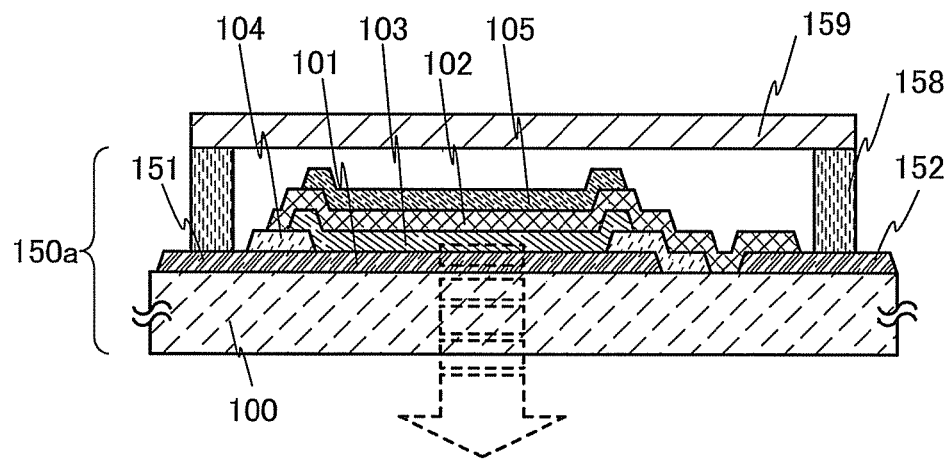
FIGS. 1A to 1C are views each illustrating a structure of a light-emitting element according to one embodiment.

Embodiments will be described in detail with reference to drawings. Note that the present invention is not limited to the following description, and it will be easily understood by those skilled in the art that various changes and modifications can be made without departing from the spirit and scope of the present invention. Therefore, the present invention should not be construed as being limited to the description of the following embodiments. Note that in the structures of the invention described below, the same portions or portions having similar functions are denoted by the same reference numerals in different drawings, and description of such portions is not repeated.

[Embodiment 1]

In this embodiment, a light-emitting element which includes a layer containing a light-emitting organic compound between an electrode containing a fusible alloy and an electrode which transmits visible light, in which the electrode containing the fusible alloy is in contact with a layer containing an organic composition having thermal fusibility, and in which the melting point of the fusible alloy is higher than that of the organic composition having thermal fusibility and lower than temperature at which the layer containing a light-emitting organic compound is damaged, will be described with reference to FIGS. 1A to 1C, FIGS. 2A and 2B, and FIGS. 3A to 3C.

FIG. 1A illustrates a structure of a cross section of a light-emitting element according to one embodiment of the present invention. A light-emitting element 150a illustrated in FIG. 1A includes a first electrode 101 over a substrate 100; a partition wall 104 having an opening over the first electrode 101; a second electrode 102; a layer 103 containing a light-emitting organic compound between the first electrode 101 and the second electrode 102; and a layer 105 containing an organic composition having thermal fusibility over the second electrode 102.

Further, the light-emitting element 150a is sealed between a sealant 159 and the substrate 100 which are bonded to each other using a sealing member 158 surrounding the light-emitting element 150a, and is isolated from the air. In addition, a first terminal 151 electrically connected to the first electrode 101 in the light-emitting element 150a and a second thermal 152 electrically connected to the second electrode 102 in the light-emitting element 150a are provided.

<Electrode containing Fusible Alloy>

The second electrode 102 of the light-emitting element 150a contains a fusible alloy. An example of an alloy that can be used for the second electrode 102 is a fusible alloy which has conductivity and the melting point of which is lower than the upper temperature limits of other components of the light-emitting element 150a. Further, the melting point is preferably higher than environmental temperature at which the light-emitting element is used and stored. Specifically, the melting point is preferably higher than 100° C. and less than or equal to 200° C.

Note that the "upper temperature limit" means a temperature at which functions of the components other than the second electrode 102 (hereinafter, referred to as "other components") are impaired or significantly deteriorate. Examples of the other components are the sealing member 158 and the sealant 159 in addition to the substrate 100, the first electrode 101, the partition wall 104, and the layer 103 containing a light-emitting organic compound. Further, in a light-emitting device including the light-emitting element 150a, the "other components" also includes other components for forming the light-emitting device. In other words, the "other components" refer to the components that are other than the second electrode, influenced by heat generated by a short-circuit failure which occurs in the light-emitting element 150a, and thus make the function of the light-emitting device impaired or deteriorate significantly. Since the layer containing a light-emitting organic compound contains an organic compound which is likely to be affected by heat and has a small thickness, it is likely to be damaged at a relatively low temperature among the other components.

<Fusible Alloy>

Specifically, the melting point of the fusible alloy that can be applied to the light-emitting element exemplified in this embodiment is higher than 100° C. and lower than or equal to 200° C., and a variety of materials can be used. Among alloys each containing one selected from bismuth (Bi), indium (In), lead (Pb), tin (Sn), and zinc (Zn), an alloy the melting point of which is adjusted to be higher than 100° C. and lower than or equal to 200° C. can be typically used. Note that a fusible alloy to which silver (Ag), copper (Cu), and/or antimony (Sb) is added as a modifier can also be used.

An example of a fusible alloy having the melting point of 110° C. includes an alloy containing Sn, In, and Bi at 46 wt %, 50 wt %, and 4 wt %, respectively. An example of a fusible alloy having the melting point of 126° C. includes an alloy containing Sn, In, and Pb at 43 wt %, 46.5 wt %, and 10.5 wt %, respectively. An example of a fusible alloy having the melting point of 130° C. includes an alloy containing Sn, In, and Pb at 48 wt %, 34 wt %, and 18 wt %, respectively. An example of a fusible alloy having the melting point of 135° C. includes an alloy containing Sn, Pb, Cd, and In at 46.5 wt %, 30 wt %, 17 wt %, and 6.5 wt %, respectively. An example of a fusible alloy having the melting point of 145° C. includes an alloy containing Sn, Pb, and Cd at 50 wt %, 32 wt %, and 18 wt %, respectively. An example of a fusible alloy having the melting point of 147° C. includes an alloy containing Sn, Pb, and In at 52 wt %, 27 wt %, and 21 wt %, respectively. An example of a fusible alloy having the melting point of 164° C. includes an alloy containing Sn, Pb, and Bi at 47.5 wt %, 40.5 wt %, and 12 wt %, respectively. An example of a fusible alloy having the melting point of 183° C. includes an alloy containing Sn and Pb at 63 wt % and 37 wt %, respectively.

Note that a fusible alloy containing In, Sn, and Ag is preferable since the number of the elements contained therein is small and such a fusible alloy has a relatively low toxicity to human bodies. For example, a fusible alloy having the melting point of 144° C. can be formed by containing In, Sn, and Ag at 95 wt %, 2 wt %, and 3 wt %, respectively.

Further, a stack of the fusible alloy containing the above-described materials and another conductive film containing a material other than the above-described materials can be used. The materials and a conductive film with high conductivity of Ag, Al, Cu, or the like are stacked, whereby the sheet resistance of the electrode containing the fusible alloy can be reduced, so that unevenness in luminance which is likely to be generated in a light-emitting region of a light-emitting element can be reduced. Furthermore, a conductive film having a work function adjusted in consideration of a carrier-injection property may be stacked on a side of the electrode containing the fusible alloy which is in contact with the layer containing a light-emitting organic compound. Specifically, in the case where the second electrode 102 is used as an anode, a structure in which a conductive film having an absolute value of a work function of higher than or equal to 4.0 eV is provided is particularly preferable. In the case where the second electrode 102 is used as a cathode, a structure in which a conductive film having an absolute value of a work function of lower than or equal to 4.0 eV is provided is particularly preferable.

In order to adjust a work function, another metal can be added. For example, by addition of an alkali metal typified by Li, Mg, or an alkaline earth metal typified by Ca, the absolute value of a work function can be made smaller.

Note that in the case where the electrode of the light-emitting element according to one embodiment of the present invention has a structure in which a fusible alloy and a conductive film are stacked, the thickness of the conductive film is preferably approximately several nanometers to about ten nanometers. When the thickness of the conductive film is less than or equal to 1 nm, the stacked-layer structure is not effective, and when the thickness of the conductive film is greater than about ten nanometers, flow of a fusible alloy reaching the melting point is disturbed. Alternatively, the composition of the conductive film may be determined so that a melted fusible alloy and the conductive film become a new alloy at its melting point.

Further, a structure in which a fusible alloy and a film containing graphene, nanowhisker, or the like are stacked can also be employed.

<Layer Containing Organic Composition Having Thermal Fusibility>

The light-emitting element 150a includes the layer 105 containing the organic composition having thermal fusibility, which is in contact with the second electrode 102. As a material that can be used for the layer 105 containing the organic composition having thermal fusibility, a composition having an insulating property and having fluidity at the melting point of the fusible alloy contained in the second electrode 102 can be given. The melting point is preferably higher than environmental temperature at which the light-emitting element 150a is used and stored.

Note that here, "fluidity" refers to a property of flow and movement of an organic composition having thermal fusibility. Accordingly, any organic composition having thermal fusibility, even an organic composition the whole of which is melted and becomes a liquid or becomes a liquid into which a solid particle or the like is dispersed, is acceptable as long as it flows and moves as a whole.

<Organic Composition Having Thermal Fusibility>

The melting point of the organic composition having thermal fusibility that can be applied to the light-emitting element exemplified in this embodiment is, specifically, higher than or equal to 100° C. and lower than 200° C., and a variety of materials can be used. Typically, among organic compositions each containing one selected from rosin, wax, and an acrylic resin, one whose melting point is adjusted to be higher than or equal to 100° C. and lower than 200° C. can be used. Note that flux or the like can be added as a modifier.

As the organic composition having thermal fusibility, a variety of organic materials can be used. Specific examples of rosin are hydrogen-containing rosin, disproportionated rosin, rosin ester, a rosin modified phenol resin, a rosin modified maleic acid resin, a rosin modified xylene resin, or the like can be given. As wax, natural wax, petroleum wax, synthetic wax, higher fatty acid, and the like can be given. Specific examples of wax include candelilla wax, montan wax, ceresin wax, paraffin wax, microcrystalline wax, oxidized wax, and ester wax. Examples of a resin having thermal fusibility include polystyrene, an acrylic resin, a methacrylic resin, styrene-butyl acrylate copolymer, a styrene-butadiene copolymer, polyester, an epoxy resin, and polypropylene.

Further, it is preferable that the organic composition having thermal fusibility be in a solidified state at environmental temperature at which the light-emitting element is used and stored because force applied to the light-emitting element can be dispersed and the layer containing the organic composition having thermal fusibility serves as a protection film.

The thickness of the layer containing the organic composition having thermal fusibility is larger than that of the electrode containing the fusible alloy. The thickness of the layer containing the organic composition having thermal fusibility is made large, whereby a surface of the electrode containing the fusible alloy which is melted due to heat generated when a short-circuit failure occurs can be covered without interruption, so that a surface of the fusible alloy can shrink easily, which is preferable. The thickness of the layer containing the organic composition having thermal fusibility is greater than or equal to 1 μm and less than or equal to 5 mm, preferably greater than or equal to 10 μm and less than or equal to 2 mm. When the thickness of the layer containing the organic composition having thermal fusibility is too small, movement of the electrode containing the fusible alloy is disturbed, whereas when the thickness is too large, the light-emitting element becomes heavy as a whole.

<Operation of Insulating Short-Circuit Failure which Occurs>

Figure 3A:
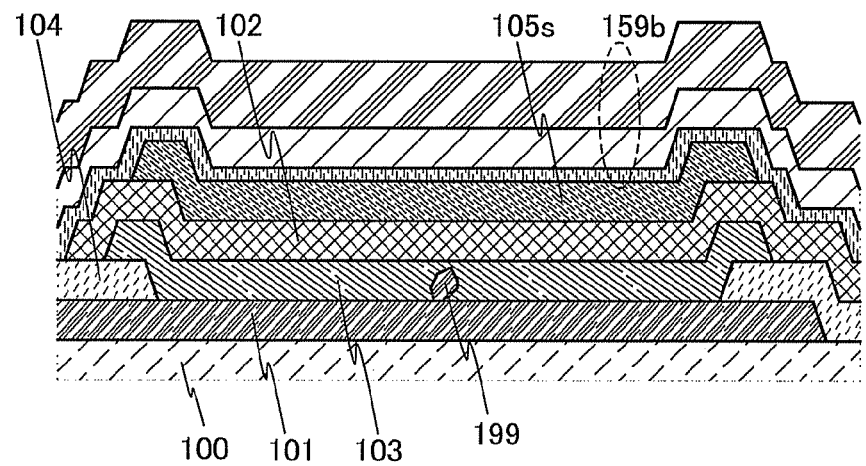
FIGS. 3A to 3C are views illustrating a portion where a short-circuit failure occurs in a light-emitting element according to one embodiment.
Figure 3B:
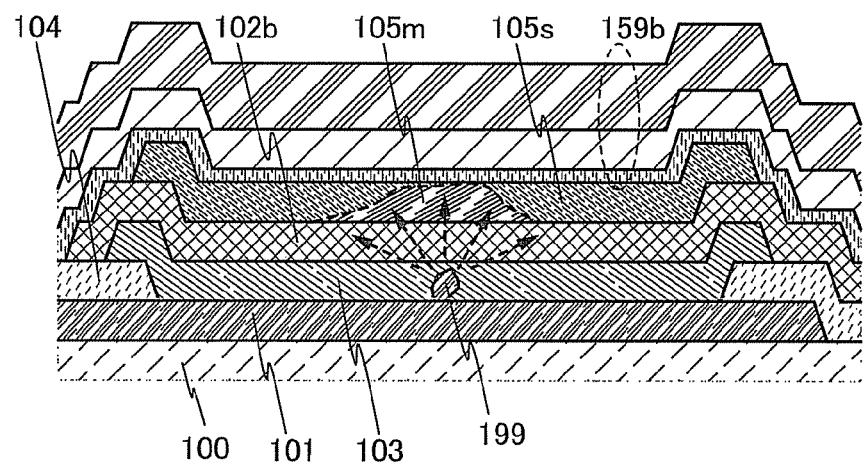
Figure 3C:
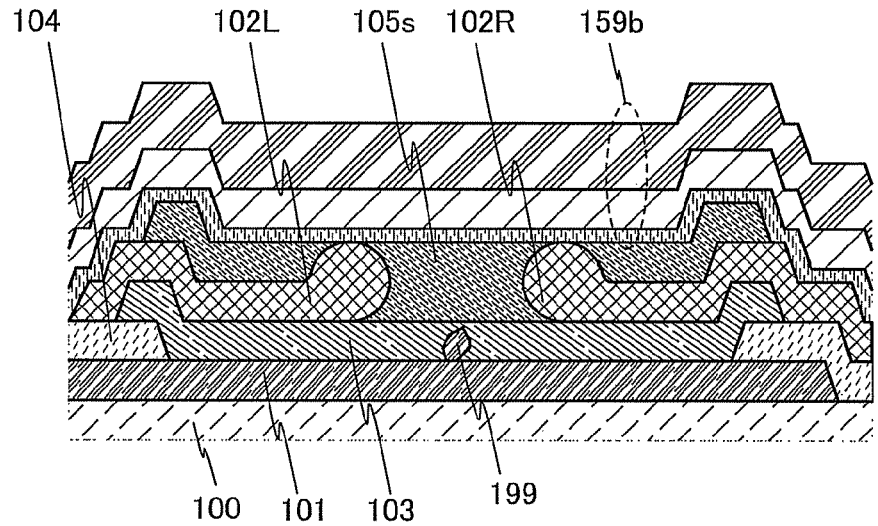

Next, operation of insulating a short-circuit failure which occurs in a light-emitting element according to one embodiment of the present invention will be described with reference to FIGS. 3A to 3C. Note that a light-emitting element illustrated in FIGS. 3A to 3C has the same structure as a light-emitting element 150b which will be described later in Modification Example 1 with reference to FIG. 1B. Further, FIGS. 3A to 3C are enlarged views each illustrating a cross section of a vicinity of a light-emitting region of the light-emitting element. Note that the light-emitting element illustrated in FIGS. 3A to 3C is different from the light-emitting element 150b illustrated in FIG. 1B in that it includes a conductive foreign substance 199 between the first electrode 101 and the second electrode 102; in other words, a short-circuit failure exists (see FIG. 3A).

The light-emitting element exemplified in FIG. 3A includes, over the substrate 100 which transmits visible light, the first electrode 101 which transmits visible light; the second electrode 102 containing the fusible alloy; and the layer 103 containing a light-emitting organic compound provided therebetween. Further, the second electrode 102 containing the fusible alloy is in contact with a layer 105s containing an organic composition having thermal fusibility. In addition, the melting point T2 of the fusible alloy is higher than the melting point T1 of the organic composition having thermal fusibility and lower than temperature T3 at which the layer 103 containing a light-emitting organic compound is damaged.

When power is supplied between the first electrode 101 and the second electrode 102 in the light-emitting element, current concentrates on the conductive foreign substance 199. Then, a short-circuit failure caused by the conductive foreign substance 199 generates heat, and the heat first melts the layer 105s containing the organic composition having thermal fusibility. The layer 105s containing the organic composition having thermal fusibility in the vicinity of the conductive foreign substance 199 is melted to be a layer 105m containing a melted organic composition (see FIG. 3B).

Next, power continues to be supplied to a portion where a short-circuit failure occurs, whereby temperature in the vicinity of the conductive foreign substance 199 is further increased, and when the temperature finally exceeds the melting point T2 of the fusible alloy contained in the second electrode 102, the second electrode 102 containing the fusible alloy is melted.

Since the surface tension of the second electrode 102 containing the melted fusible alloy is larger than that of the layer containing the organic composition having thermal fusibility, which is in contact with the second electrode 102, the surface area of the second electrode 102 shrinks. Since the layer 105m containing the organic composition having thermal fusibility has been already melted to increase its fluidity, it can provide a space necessary to change the shape of the electrode containing the fusible alloy.

Then, the electrode containing the melted fusible alloy starts to shrink due to the surface tension, and finally a hole is formed in a portion where the temperature increases significantly due to a short-circuit failure (see FIG. 3C). While the position of the electrode containing the melted fusible alloy is partly exchanged with the position of the layer 105m containing the melted organic composition, the electrode containing the melted fusible alloy recedes from a region having high temperature where the electrode containing, the melted fusible alloy flows easily to a solidified region having low temperature. Note that as a result of formation of the hole in the vicinity of the conductive foreign substance 199 where the temperature is increased the most, power supply to the conductive foreign substance 199 is stopped.

When the temperature is lowered as a result of stop of power supply and is lower than the melting point T2, the second electrode containing a fusible alloy is solidified. When the temperature is lower than the melting point T1, the layer 105m containing the melted organic composition is solidified to be the layer 105s containing the organic composition having thermal fusibility.

In this manner, a structure in which the electrode containing the fusible alloy recedes is obtained. As a result, a light-emitting element in which power is not consumed wastefully after a short-circuit failure occurs can be provided. Further, a portion where the electrode containing the fusible alloy recedes is filled with the organic composition having thermal fusibility. As a result, the layer 103 containing a light-emitting organic compound is not exposed in the portion where the electrode containing the fusible alloy recedes, so that a light-emitting element in which the layer 103 containing a light-emitting organic compound is protected by the organic composition having thermal fusibility can be provided. This is because the organic composition having thermal fusibility can suppress diffusion of an impurity into the layer 103 containing a light-emitting organic compound and can disperse stress externally applied to the layer 103 containing a light-emitting organic compound.

<Other Structure>

Note that the light-emitting element 150a exemplified in FIG. 1A has a bottom-emission structure in which light is extracted through the first electrode 101 provided on the substrate 100 side. Accordingly, the substrate 100 and the first electrode 101 are formed using a material which transmits light emitted from the layer 103 containing a light-emitting organic compound.

Further, a light-emitting region of the light-emitting element 150a is a region surrounded by the partition wall 104. The partition wall 104 is provided between the first electrode 101 and the second electrode 102 of the light-emitting element 150a and has an insulating property, which prevents short circuit between the first electrode 101 and the second electrode 102 outside the light-emitting region.

The layer 103 containing a light-emitting organic compound of the light-emitting element 150a includes at least one light-emitting layer containing a light-emitting organic compound, and in addition, a layer selected from a hole-injection layer, a hole-transport layer, an electron-transport layer, an intermediate layer, and the like can be used. Note that a structure of the layer 103 containing a light-emitting organic compound will be described in Embodiment 3 in detail; therefore, the description thereof is omitted in this embodiment.

<Light-Transmitting Substrate>

As a light-transmitting substrate that can be applied to the light-emitting element exemplified in this embodiment, a variety of materials can be given. Typically, in addition to a glass substrate, a substrate or a film made of a flexible synthetic resin such as plastic can be used as long as it prevents diffusion of an impurity contained in the air into the light-emitting element and can withstand processing temperature in manufacturing steps. Note that when a material having a gas barrier property such that a vapor permeability is less than or equal to $10^{-5}$ g/m$^2$·day, preferably less than or equal to $10^{-6}$ g/m$^2$·day is used, the reliability of the light-emitting element can be improved.

For example, a glass plate of soda-lime glass, clear flat glass, lead glass, tempered glass, ceramic glass, or the like can be used. Further, a non-alkali glass substrate of aluminosilicate glass, barium borosilicate glass, aluminoborosilicate glass, or the like; a quartz substrate; or a ceramic substrate; or the like can be used.

For example, the following can be given: polyester; polyethylene terephthalate (PET); polyether sulfone (PES), polyethylene naphthalate (PEN); polycarbonate (PC); a polyamide-based synthetic fiber; polyether etherketone (PEEK); polysulfone (PSF); polyether imide (PEI); polyarylate (PAR); polybutylene terephthalate (PBT); polyimide; an acrylonitrile butadiene styrene resin; poly vinyl chloride; polypropylene; poly vinyl acetate; an acrylic resin, and the like. In particular, a barrier film for preventing diffusion of an impurity contained in the air into the light-emitting element is preferably provided.

Further, in addition to a composite material in which the above-described materials are bonded to each other, a composite material of a glass fiber or the like and resin, or the like can also be used.

<Light-Transmitting Conductive Film>

As a light-transmitting conductive film that can be applied to the light-emitting element exemplified in this embodiment, a variety of materials can be given. Typically, in addition to an oxide semiconductor film, a conductive polymer film, or the like can be used as long as it can withstand processing temperature in manufacturing steps.

For example, a conductive film containing indium oxide, indium tin oxide (ITO), indium zinc oxide, zinc oxide, gallium-doped zinc oxide (GZO), aluminum-doped zinc oxide (AZO), or the like can be used.

For example, a conductive composition film containing polyaniline or a derivative thereof, polypyrrole or a derivative thereof, polythiophene or a derivative thereof (PEDOT or the like), or a conductive high molecule (also referred to as a conductive polymer) such as a copolymer of two or more of the above-described materials can be used.

In addition to the above-described materials, a film formed using graphene, nanowhisker, or the like can also be used.

<Insulating Partition Wall>

As an insulating partition wall that can be applied to the light-emitting element exemplified in this embodiment, partition walls formed using a variety of insulating materials can be given. Typically, an inorganic insulating material can be used other than an organic resin.

For example, a material selected from polyimide, acrylic resin, polyamide, epoxy resin, and the like can be used. Further, a photosensitive resin material is preferably used because partition walls can be formed in a variety of shapes.

For example, a material selected from silicon oxide, silicon nitride, silicon oxynitride, aluminum oxide, and the like can be used.

Further, combination of organic resin and an inorganic material can be used so that the first electrode and the second electrode are insulated from each other.

The partition wall can have a variety of shapes. Typically, the partition wall can have a shape which causes disconnection to separate layers each containing a light-emitting organic compound and/or the second electrodes in adjacent light-emitting elements, or a shape which prevents disconnection so as to continue these layers.

For example, as a shape which causes disconnection, it is possible to use a shape in which a stage portion of the partition wall protrudes in a direction parallel to the substrate surface as compared to a leg portion of the partition wall, specifically, a shape such as an inversely tapered shape or an eave shape.

For example, in order to prevent disconnection, it is possible to use a shape having a taper angle of an end portion of greater than or equal to 10° and less than or equal to 85°, preferably greater than or equal to 60° and less than or equal to 80°.

<Sealant>

As a sealing structure that can be applied to the light-emitting element exemplified in this embodiment, a variety of sealing structures can be given. Typically, a structure in which the light-emitting element is sealed between the substrate provided with the light-emitting element and a sealing substrate using a sealing member which surrounds the light-emitting element, or a structure in which the light-emitting element is covered with a sealing film, can be give as an example. As a sealing substrate or a sealing film, any substrate or any film can be used as long as it can prevent diffusion of an impurity contained in the air into the light-emitting element and can be formed at processing temperature which does not damage the light-emitting element. Note that when a material having a gas barrier property such that a vapor permeability is less than or equal to $10^{-5}$ g/m$^2$·day, preferably less than or equal to $10^{-6}$ g/m$^2$·day is used, a light-emitting element with high reliability can be provided.

For example, as a sealing substrate, in addition to a substrate that can be used as a substrate for supporting the light-emitting element, a glass substrate, a metal substrate, or a substrate using a flexible synthetic resin such as plastic can also be used.

For example, as a sealing film, it is possible to use an inorganic insulating film formed using silicon nitride, aluminum oxynitride, aluminum oxide, aluminum nitride, diamond-like carbon (DLC), and the like.

Further, a composite material in which materials selected from the above are bonded to each other or are stacked, or the like can also be used.

Modification Example 1

Figure 1B:
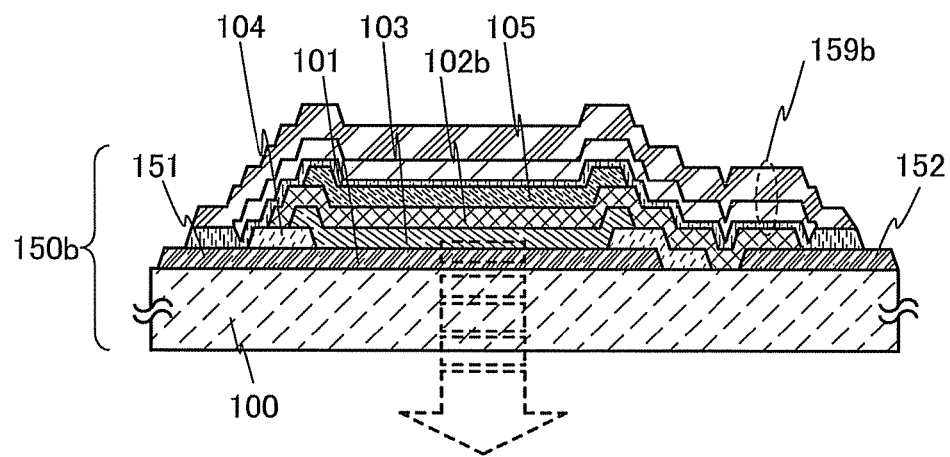

Another embodiment of the light-emitting element according to one embodiment of the present invention will be described with reference to FIG. 1B. The light-emitting element 150b has a different sealing structure from the light-emitting element 150a illustrated in FIG. 1A. Specifically, a sealant 159b in film form is provided over the second electrode 102 containing the fusible alloy with the layer 105 containing the organic composition having thermal fusibility interposed therebetween.

By provision of the layer 105 containing the organic composition having thermal fusibility between the sealant 159b in film form and the second electrode 102b containing the fusible alloy, the second electrode 102b containing the melted fusible alloy shrinks easily when a short-circuit failure occurs. On the other hand, if the sealant 159b in film form is provided in contact with the second electrode 102b, the sealant 159b prevents the second electrode 102b containing the melted fusible alloy from shrinking. Thus, by provision of the layer 105 containing the organic composition having thermal fusibility between the sealant 159b and the second electrode 102b, a space necessary to change the shape of the electrode containing the fusible alloy can be provided.

Modification Example 2

Figure 1C:
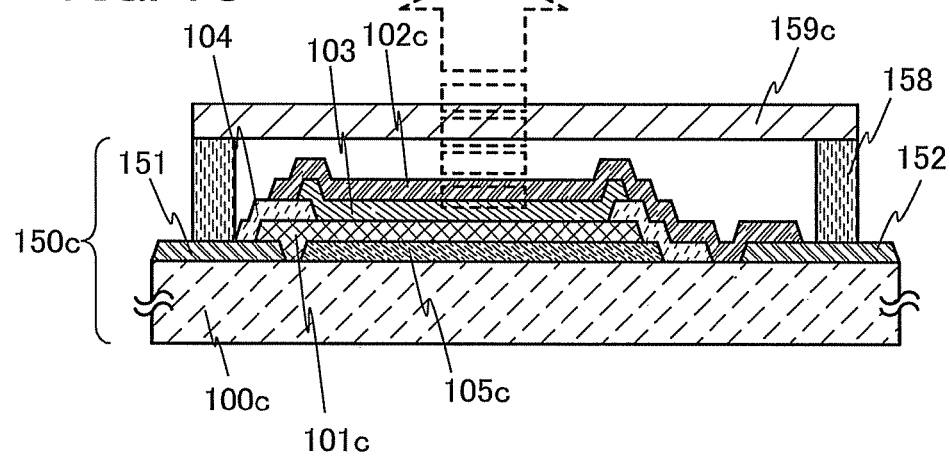

Another embodiment of the light-emitting element according to one embodiment of the present invention will be described with reference to FIG. 1C. A light-emitting element 150c differs from the light-emitting element 150a of FIG. 1A in a direction in which light is emitted. Specifically, a second electrode 102c is formed using a light-transmitting conductive film, and a sealant 159c has a light-transmitting property. Accordingly, a first electrode 101c includes a fusible alloy, and a layer 105c containing an organic composition having thermal fusibility is provided between the first electrode 101c and a substrate 100c.

By provision of the layer 105c containing the organic composition having thermal fusibility between the substrate 100c and the first electrode 101c containing the fusible alloy, the first electrode 101c containing the melted fusible alloy shrinks easily when a short-circuit failure occurs. On the other hand, if the substrate 100c is provided in contact with the first electrode 101c, the substrate 100c prevents the first electrode 101c containing the melted fusible alloy from shrinking. Thus, by provision of the layer 105c containing the organic composition having theimal fusibility between the substrate 100c and the first electrode 101c, a space necessary to change the shape of the first electrode 101c containing the fusible alloy can be provided.

Modification Example 3

Figure 2A:
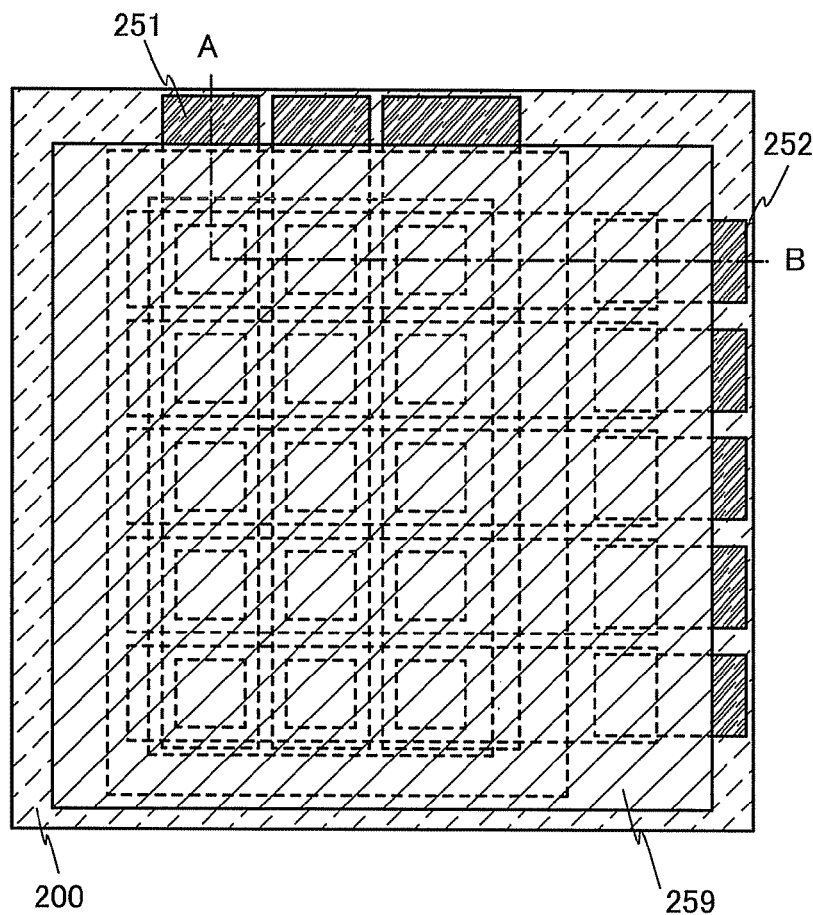
FIGS. 2A and 2B are views illustrating a light-emitting panel including a plurality of light-emitting elements according to one embodiment.
Figure 2B:
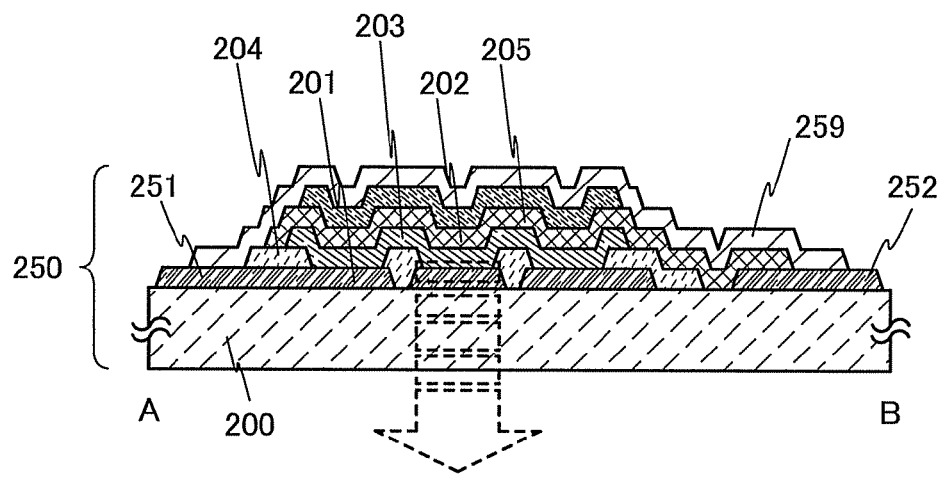

A light-emitting panel provided with a plurality of light-emitting elements according to one embodiment of the present invention is also included in one embodiment of the present invention. An embodiment of the light-emitting panel according to one embodiment of the present invention will be described with reference to FIGS. 2A and 2B. FIG. 2A is a top view of the light-emitting panel and FIG. 2B is a cross-sectional view taken along line A-B of FIG. 2A.

A light-emitting panel 250 includes a plurality of light-emitting elements arranged in five rows and three columns. The light-emitting panel 250 includes first electrode groups 201 arranged in three columns and second electrode groups 202 arranged in four rows. A first terminal group 251 includes an extraction terminal provided for each of the first electrode groups 201, and a second terminal group 252 includes an extraction terminal provided for each of the second electrode groups 202. Further, a layer 203 containing a light-emitting organic compound is provided in contact with an opening of a partition wall 204 provided in each of portions where the first electrode groups 201 and the second electrode groups 202 intersect and overlap with each other.

The light-emitting panel exemplified in this embodiment is a so-called passive type light-emitting panel. One terminal is selected from the first terminal group 251 and one terminal is selected from the second terminal group 252, and voltage greater than or equal to the emission start voltage of the light-emitting element is applied in a forward direction, so that the light-emitting element in a portion where both of the terminals intersect with each other can emit light selectively. In the passive type light-emitting panel, a light-emitting element in a portion where the terminals intersects with each other emits light in accordance with an image signal, so that an image can be displayed.

When the whole light-emitting element does not emit light due to a short-circuit failure, a point defect is generated in the light-emitting panel, and an image cannot be displayed normally. However, as for the light-emitting element according to one embodiment of the present invention, only a portion where a short-circuit failure occurs in the light-emitting element is insulated; therefore, the light emitting-element other than the portion emits light even if a short-circuit failure occurs. Further, heat generated in the portion where a short-circuit failure occurs does not damage an adjacent light-emitting element.

Further, in the light-emitting panel exemplified in this embodiment, a plurality of light-emitting elements can emit light concurrently. At this time, it can be said that the light-emitting elements are connected in parallel.

When a short-circuit failure occurs in one of the light-emitting elements connected in parallel, current concentrates on the portion where a short-circuit failure occurs, and thus, current is less likely to flow to other light-emitting elements. As a result, power is consumed wastefully, and in addition, the brightness of the entire light-emitting panel is reduced. However, as for the light-emitting element according to one embodiment of the present invention, only a portion where a short-circuit failure occurs in the light-emitting element is insulated; therefore, even if a short-circuit failure occurs, power is not consumed wastefully, and the brightness of the entire light-emitting panel is not reduced. Further, heat generated in the portion where a short-circuit failure occurs does not damage an adjacent light-emitting element.

The light-emitting element according to one embodiment of the present invention includes the layer containing a light-emitting organic compound between the electrode containing the fusible alloy and the electrode which transmits visible light, and the electrode containing the fusible alloy is in contact with the layer containing the organic composition having thermal fusibility. In addition, the melting point of the fusible alloy is higher than the melting point of the organic composition having thermal fusibility and lower than temperature at which the layer containing a light-emitting organic compound is damaged.

Thus, before the layer containing a light-emitting organic compound is damaged by heat generated when a short-circuit failure in the light-emitting element occurs, the layer containing the organic composition having thermal fusibility is melted first, and then the electrode containing the fusible alloy is melted.

Next, the electrode containing the melted fusible alloy starts to shrink, and finally, a hole is fainted in the portion where the temperature increases significantly due to a short-circuit failure, so that power supply to the portion where a short circuit failure occurs is stopped. The electrode containing the melted fusible alloy recedes from the region having high temperature where the electrode containing the melted fusible alloy flows easily to the solidified region having low temperature. Then, the layer containing the melted organic composition having thermal fusibility flows into the hole generated in the fusible alloy and fills the hole. Thus, a short-circuit failure is eliminated and the organic composition having thermal fusibility fills a portion where the electrode containing the fusible alloy recedes.

As a result, according to one embodiment of the present invention, a light-emitting element in which power is not consumed wastefully even if a short-circuit failure occurs can be provided. Further, a light-emitting panel in which reliability of an adjacent light-emitting element is not lowered even if a short-circuit failure occurs can be provided.

Note that this embodiment can be combined with any of the other embodiments in this specification as appropriate.

[Embodiment 2]

Figure 4A:
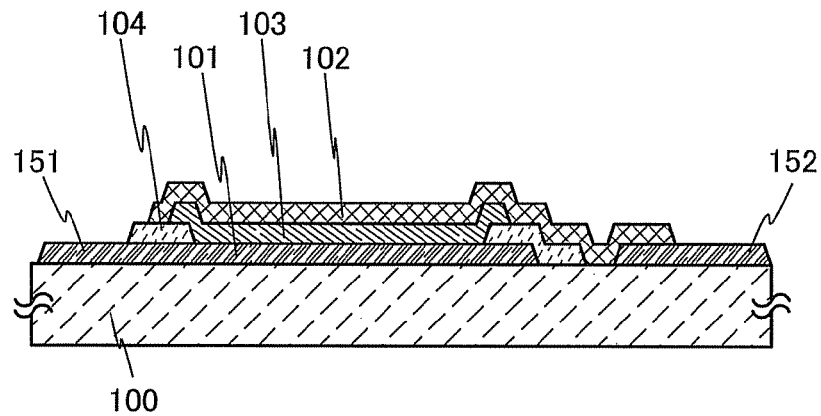
FIGS. 4A to 4C are views for explaining a method for manufacturing a light-emitting element according to one embodiment.
Figure 4B:
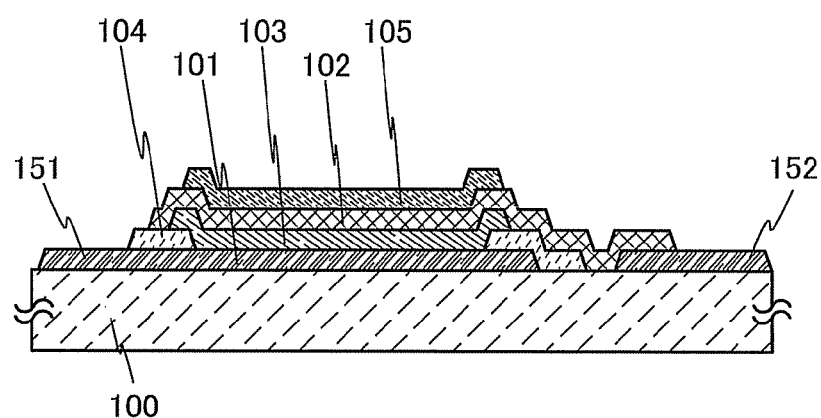
Figure 4C:
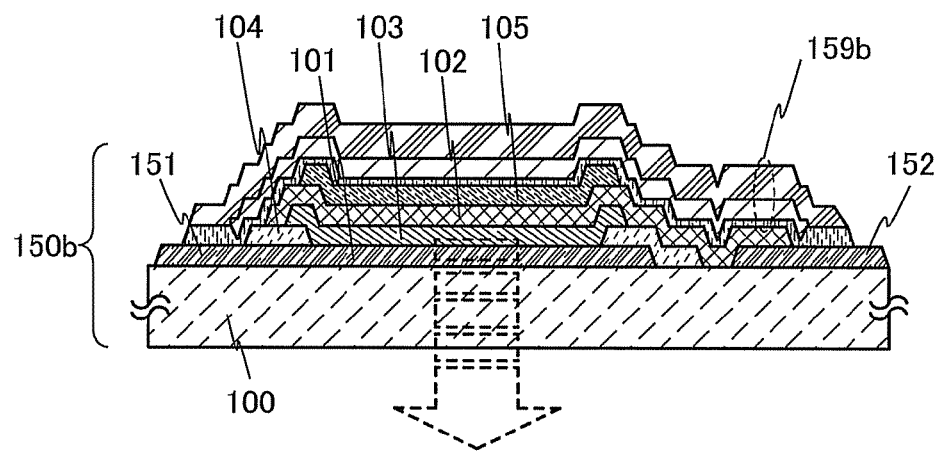

In this embodiment, a method for manufacturing a light-emitting element which includes a layer containing a light-emitting organic compound between an electrode containing a fusible alloy and an electrode which transmits visible light, where the electrode containing the fusible alloy is in contact with a layer containing an organic composition having thermal fusibility, and where the melting point of the fusible alloy is higher than the melting point of the organic composition having thermal fusibility and lower than temperature at which the layer containing a light-emitting organic compound is damaged, will be described with reference to FIGS. 4A to 4C.

FIGS. 4A to 4C illustrate a method for manufacturing a light-emitting element according to one embodiment of the present invention. The method for manufacturing a light-emitting element exemplified in FIGS. 4A to 4C is one example of methods for manufacturing the light-emitting element 150b exemplified in Embodiment 1.

<Method for Forming First Electrode>

A light-transmitting conductive film is formed over a light-transmitting substrate. As the light-transmitting substrate and the light-transmitting conductive film, a variety of materials exemplified in Embodiment 1 can be used. As a method for forming the light-transmitting conductive film, any method may be employed as long as a method appropriate for the material is selected; for example, a sputtering method or a coating method can be used.

Next, an unnecessary portion of the light-transmitting conductive film is removed. As a method for removing the unnecessary portion, a method for removing the unnecessary portion by selective etching with use of a resist mask can be used, for example. Note that when a method for forming a conductive film selectively is used, the conductive film can be formed to have a variety of shapes without using a photoresist, or the like, which is convenient. As a method for forming a conductive film selectively, for example, a mask sputtering method, a printing method, or an inkjet method can be given.

In this embodiment, a light-transmitting non-alkali glass substrate is used as the substrate 100, and an indium tin oxide (ITO) film is formed thereover as a light-transmitting conductive film. The thickness of the substrate 100 is 0.7 mm, and the conductive film is formed to have a thickness of 110 nm by a sputtering method, for example. Further, the first electrode 101, the first terminal 151, and the second terminal 152 are formed using a photoresist.

<Method for Forming Partition Wall>

Next, the partition wall 104 having an opening is formed over the first electrode 101. For the partition wall 104, a variety of materials exemplified in Embodiment 1 can be used. As a method for forming the partition wall 104, any method may be employed as long as a method appropriate for the material is selected; for example, a method in which a continuous film is formed by a coating method or a sputtering method and removed by selective etching with use of a photoresist to form an opening can be employed. Note that when the partition wall is formed using a photosensitive material, an opening is easily fowled using a photomask, and in addition, a shape or a taper angle of an end portion of the opening can be adjusted by selection of a positive or negative photosensitive material and by adjustment of light-exposure conditions, which is preferable.

In this embodiment, the partition wall is formed using positive polyimide so that the taper angle of the end portion is greater than or equal to 60° and less than or equal to 80°.

<Method For Forming Layer Containing Light-Emitting Organic Compound>

Next, the layer 103 containing a light-emitting organic compound is formed in the opening of the partition wall 104 so as to cover the first electrode 101. A structure of the layer 103 containing a light-emitting organic compound will be described in detail in Embodiment 3, and the description is omitted in this embodiment. As a method for forming the layer 103 containing a light-emitting organic compound, any method may be employed as long as a method appropriate for the material is selected; for example, a dry process such as a vacuum evaporation method, and a wet process such as a coating method, a printing method, or an ink jet method can be used. Note that before formation of the layer containing a light-emitting organic compound, it is preferable that the substrate 100 over which the first electrode 101 and the partition wall 104 are formed be subjected to heat treatment in vacuum as pretreatment so that an impurity is removed. This is because an impurity such as moisture adsorbed on the substrate causes decrease in reliability of the light-emitting element.

<Method for Forming Electrode containing Fusible Alloy>

Next, as the second electrode 102, the electrode containing the fusible alloy is formed in a portion which overlaps with at least the opening of the partition wall 104 and over the layer 103 containing a light-emitting organic compound. As a method for forming the electrode containing the fusible alloy, any method may be employed as long as a method appropriate for the material is selected; for example, a vacuum evaporation method can be used.

Note that the electrode containing the fusible alloy is preferably formed by a co-evaporation method. The melting point of the fusible alloy depends on its composition; therefore, when a co-evaporation method is employed, the composition is adjusted easily.

Further, in the case where a region having a different composition is provided for the electrode containing the fusible alloy, a different material may be evaporated successively. For example, after a material having a high carrier-injection property is evaporated on a side in contact with the layer 103 containing a light-emitting organic compound, a fusible alloy may be evaporated. Alternatively, a layer with low electric resistance may be provided inside the fusible alloy or in contact with one surface or both surfaces of the electrode containing the fusible alloy.

In this embodiment, with the use of an evaporation source for indium (In), an evaporation source for tin (Sn), and an evaporation source for silver (Ag), co-evaporation is performed so that the weight ratio of In to Sn and Ag is adjusted to be 95:2:3 (=In:Sn:Ag), whereby the second electrode 102 containing the fusible alloy can be formed (see FIG. 4A).

<Method for Forming Layer Containing Organic Composition Having Thermal Fusibility>

Next, the layer 105 containing the organic composition having thermal fusibility is formed over the second electrode 102 containing the fusible alloy. As a method for forming the layer 105 containing the organic composition having thermal fusibility, any method may be employed as long as a method appropriate for the material is selected; for example, a bonding method, a coating method, a vacuum evaporation method, or the like can be used. In particular, since the organic composition having thermal fusibility exhibits fluidity by being heated, the layer 105 containing the organic composition having thermal fusibility can be formed in such a manner that a heated organic composition having thermal fusibility is sprayed on the electrode containing the fusible alloy by an ink-jet method or a spray method. The organic composition having thermal fusibility, the surface tension of which is smaller than that of the electrode containing the fusible alloy, can cover the surface of the electrode containing the fusible alloy without interruption.

Note that a bonding method is a method by which a process paper on which a layer containing an organic composition having thermal fusibility is faulted is bonded so that the layer containing the organic composition having thermal fusibility is in contact with the layer containing the fusible alloy, and the layer containing the organic composition having thermal fusibility is stacked over the layer containing the fusible alloy. A bonding method is convenient because a step of manufacturing a light-emitting element and a step of forming an organic composition having thermal fusibility in a film form are performed separately, and each step can be optimized.

Further, after the bonding, adhesion between the layer containing the organic composition having thermal fusibility and the layer containing the fusible alloy may be increased in such a manner that only the layer containing the organic composition having thermal fusibility is melted by heating the light-emitting element. By increase of the adhesion, heat generated due to a short-circuit failure which occurs is likely to be conducted to the layer containing the organic composition having thermal fusibility, so that the melting proceeds rapidly.

Note that the process paper may be removed after the bonding or may be sealed together with the light-emitting element. When it is sealed together with the light-emitting element, it serves as a protective member of the light-emitting element.

In this embodiment, a process paper made of polyester, on which Paraffin wax is formed to a thickness of 100 μm, is used, and the formed Paraffin wax is bonded so as to be in contact with the second electrode 102 containing the fusible alloy. Next, the process paper is removed, and the layer 105 containing the organic composition having thermal fusibility, which is made of Paraffin wax, is formed (see FIG. 4B).

<Method for Forming Sealant>

Next, the sealant 159b is formed over the layer 105 containing the organic composition having thermal fusibility. For the sealant 159b, a variety of materials exemplified in Embodiment 1 can be used. As a method for forming the sealant 159b, any method may be employed as long as a method appropriate for the material is selected; for example, a sputtering method, a CVD method, a coating method, a bonding method, or the like can be used.

In this embodiment, as the sealant 159b, a polyethylene naphthalate (PEN) film having a thickness of 50 nm, where a silicon nitride oxide film having a thickness of 100 nm formed by an ion plating method is provided inside a sealing region, is used. Note that the sealing region is provided so as to surround the light-emitting element, and adhesion with the sealing member is increased. As the sealing member, an epoxy resin-based adhesive can be used, for example.

In accordance with a method for manufacturing a light-emitting element according to one embodiment of the present invention, the light-emitting element includes the layer containing a light-emitting organic compound between the electrode containing the fusible alloy and the electrode which transmits visible light, and the electrode containing the fusible alloy is in contact with the layer containing the organic composition having thermal fusibility. In addition, in the light-emitting element, the melting point of the fusible alloy is higher than the melting point of the organic composition having thermal fusibility and lower than temperature at which the layer containing a light-emitting organic compound is damaged.

Thus, before the layer containing a light-emitting organic compound is damaged by heat generated when a short circuit failure in the light-emitting element occurs, the layer containing the organic composition having thermal fusibility is melted first, and then the electrode containing the fusible alloy is melted.

Next, the electrode containing the melted fusible alloy starts to shrink, and finally, a hole is formed in the portion where the temperature increases significantly due to a short-circuit failure, so that power supply to the portion where a short circuit failure occurs is stopped. The electrode containing the melted fusible alloy recedes from the region having high temperature where the electrode containing the melted fusible alloy flows easily to the solidified region having low temperature. Then, the layer containing the melted organic composition having thermal fusibility flows into the hole generated in the fusible alloy and fills the hole. Thus, a short-circuit failure is eliminated and the organic composition having thermal fusibility fills a portion where the electrode containing the fusible alloy recedes.

As a result, according to one embodiment of the present invention, a light-emitting element in which power is not consumed wastefully even if a short-circuit failure occurs can be provided. Further, a light-emitting panel in which reliability of an adjacent light-emitting element is not lowered even if a short-circuit failure occurs can be provided.

Note that this embodiment can be combined with any of the other embodiments in this specification as appropriate.

[Embodiment 3]

In this embodiment, an example of a structure of the layer 103 containing a light-emitting organic compound that can be applied to the light-emitting element which includes a layer containing a light-emitting organic compound between an electrode containing a fusible alloy and an electrode which transmits visible light, where the electrode containing the fusible alloy is in contact with a layer containing an organic composition having thermal fusibility, and where the melting point of the fusible alloy is higher than the melting point of the organic composition having thermal fusibility and lower than temperature at which the layer containing a light-emitting organic compound is damaged, will be described with reference to FIGS. 5A to 5C and FIGS. 6A and 6B.

The light-emitting element exemplified in this embodiment includes a first electrode, a second electrode, and a layer containing a light-emitting organic compound (hereinafter referred to as an EL layer) provided between the first electrode and the second electrode. One of the first electrode and the second electrode serves as an anode, and the other serves as a cathode. The EL layer is provided between the first electrode and the second electrode, and a structure of the EL layer may be selected as appropriate in accordance with materials of the first electrode and second electrode. Further, at least one of the first electrode and the second electrode contains a fusible alloy, and the other transmits visible light. An example of the structure of the light-emitting element will be described below; it is needless to say that the structure of the light-emitting element is not limited to this example.

<Structure Example 1 of Light-Emitting Element>

Figure 5A:
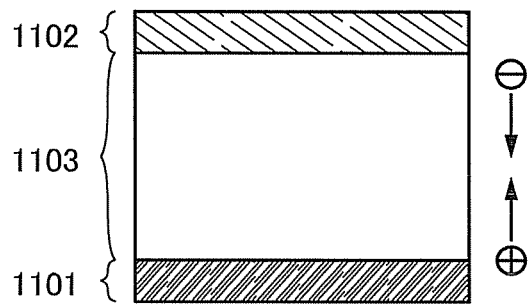
FIGS. 5A to 5C are views illustrating structures of light-emitting elements according to one embodiment.

An example of a structure of a light-emitting element is illustrated in FIG. 5A. In the light-emitting element illustrated in FIG. 5A, an EL layer 1103 is provided between an anode 1101 and a cathode 1102.

When voltage higher than the threshold voltage of the light-emitting element is applied between the anode 1101 and the cathode 1102, holes are injected to the EL layer 1103 from the anode 1101 side and electrons are injected to the EL layer 1103 from the cathode 1102 side. The injected electrons and holes are recombined in the EL layer 1103 and the light-emitting substance contained in the EL layer 1103 emits light.

The EL layer 1103 may include at least a light-emitting layer containing a light-emitting substance, and may have a structure in which a layer other than the light-emitting layer and the light-emitting layer are stacked. Examples of the layer other than the light-emitting layer are layers containing a substance having a high hole-injection property, a substance having a high hole-transport property, a substance having a poor hole-transport property (a substance which blocks holes), a substance having a high electron-transport property, a substance having a high electron-injection property, and a substance having a bipolar property (a substance having high electron-and-hole-transport properties).

Figure 5B:
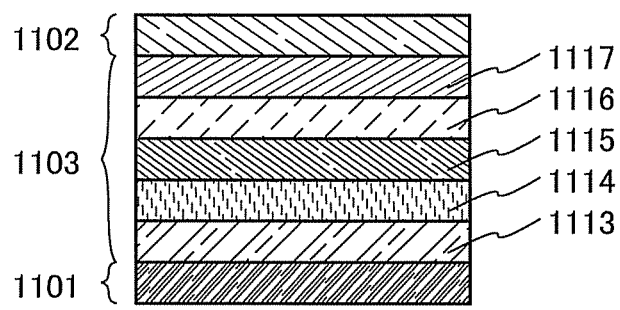

An example of a specific structure of the EL layer 1103 is illustrated in FIG. 5B. The EL layer 1103 illustrated in FIG. 5B has a structure in which a hole-injection layer 1113, a hole-transport layer 1114, a light-emitting layer 1115, an electron-transport layer 1116, and an electron-injection layer 1117 are stacked in this order from the anode 1101 side.

<Structure Example 2 of Light-Emitting Element>

Figure 5C:
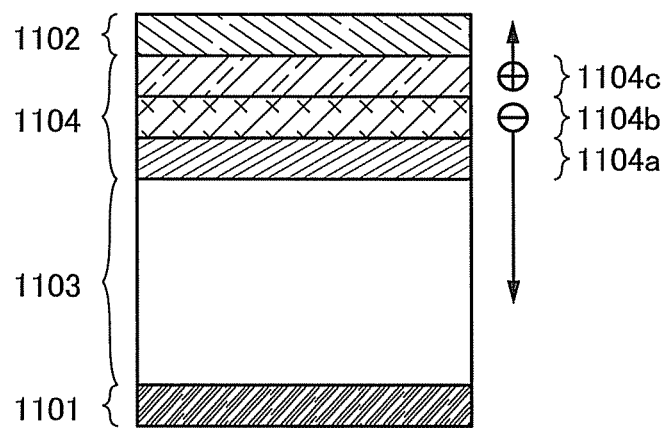

Another example of a structure of a light-emitting element is illustrated in FIG. 5C. In the light-emitting element exemplified in FIG. 5C, the EL layer 1103 is provided between the anode 1101 and the cathode 1102. Further, an intermediate layer 1104 is provided between the cathode 1102 and the EL layer 1103. Note that a structure similar to that in the above structure example 1 of the light-emitting element can be applied to the EL layer 1103 in the structure example 2 of the light-emitting element, and for the details, the description of the structure example 1 of the light-emitting element can be referred to.

The intermediate layer 1104 may be formed to include at least a charge generation region, and may have a structure in which the charge generation region and a layer other than the charge generation region are stacked. For example, a structure can be employed in which a first charge generation region 1104c, an electron-relay layer 1104b, and an electron-injection buffer 1104a are stacked in that order from the cathode 1102 side.

The behaviors of electrons and holes in the intermediate layer 1104 are described. When voltage higher than the threshold voltage of the light-emitting element is applied between the anode 1101 and the cathode 1102, in the first charge generation region 1104c, holes and electrons are generated, and the holes move into the cathode 1102 and the electrons move into the electron-relay layer 1104b. The electron-relay layer 1104b has a high electron-transport property and immediately transfers the electrons generated in the first charge generation region 1104c to the electron-injection buffer 1104a. The electron-injection buffer 1104a can reduce a barrier in injection of electrons into the EL layer 1103, and the efficiency of the electron injection into the EL layer 1103 can be improved. Thus, the electrons generated in the first charge generation region 1104c are injected into the LUMO level of the EL layer 1103 through the electron-relay layer 1104b and the electron-injection buffer 1104a.

In addition, the electron-relay layer 1104b can prevent interaction in which the substance included in the first charge generation region 1104c and the substance included in the electron-injection buffer 1104a react with each other at the interface thereof and the functions of the first charge generation region 1104c and the electron-injection buffer 1104a are damaged.

The range of choices of materials that can be used for the cathode in Structure Example 2 of the light-emitting element is wider than that of materials that can be used for the cathode in Structure Example 1 of the light-emitting element. This is because a material having a relatively high work function can be used for the cathode in Structure Example 2 as long as the cathode in Structure Example 2 receives at least holes generated by the intermediate layer.

In one embodiment of the present invention, a fusible alloy whose composition is determined depending on the melting point is used for one of the electrodes. However, the work function of the electrode is not necessarily in the range appropriate for the structure of the light-emitting element. For example, in the case where a fusible alloy is used as a cathode, the absolute value of the work function is preferably lower than 4.0 eV; however, since many metals included in a fusible alloy have a high work function, the absolute value of the work function of a fusible alloy is higher than 4.0 eV in some cases. Specifically, examples of a metal that can be used for a fusible alloy include the following, of which the work functions are also shown below: bismuth (Bi) having a work function of 4.34 eV; indium (In) having a work function of 4.09 eV; lead (Pb) having a work function of 4.25 eV; tin (Sn) having a work function of 4.42 eV; zinc (Zn) having a work function of 3.63 eV; silver (Ag) having a work function of 4.52 eV to 4.74 eV; copper (Cu) having a work function of 4.53 eV to 5.10 eV; and antimony (Sb) having a work function of 4.55 eV to 4.7 eV.

However, since the cathode in Structure Example 2 may just receive holes generated by the intermediate layer, a fusible alloy containing a metal having an absolute value of a work function of higher than or equal to 4.0 eV can be used for the cathode.

<Structure Example 3 of Light-Emitting Element>

Figure 6A:
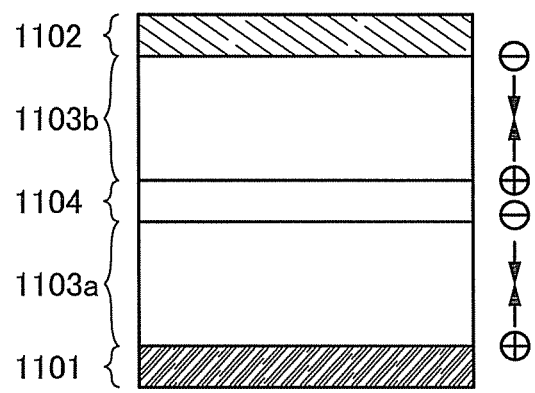
FIGS. 6A and 6B are views illustrating structures of light-emitting elements according to one embodiment.

Another example of a structure of a light-emitting element is illustrated in FIG. 6A. In the light-emitting element exemplified in FIG. 6A, two EL layers are provided between the anode 1101 and the cathode 1102. Further, the intermediate layer 1104 is provided between an EL layer 1103a and an EL layer 1103b.

Figure 6B:
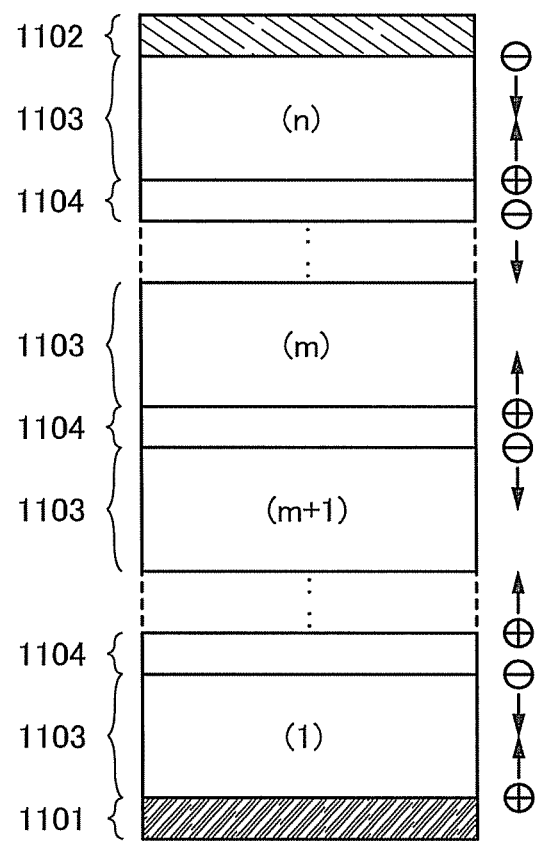

Note that the number of the EL layer which is provided between the anode and the cathode is not limited to two. The structure of the light-emitting element exemplified in FIG. 6B is a so-called a stacked-layer element structure, that is, a structure in which a plurality of EL layers 1103 is stacked. Note that in the case where n (n is a natural number of 2 or more) EL layers 1103 are provided between the anode and the cathode, the intermediate layer 1104 is provided between an m-th (m is a natural number greater than or equal to 1 and less than or equal to n−1) EL layer and an (m+1)-th EL layer.

Note that a structure similar to that in the above structure example 1 of the light-emitting element can be applied to the EL layers 1103a and 1103b in the structure example 3 of the light-emitting element; a structure similar to that in the above structure example 2 of the light-emitting element can be applied to the intermediate layer 1104 in the structure example 3 of the light-emitting element. Thus, for the details, the description of the structure example 1 of the light-emitting element or the structure example 2 of the light-emitting element can be referred to.

The behaviors of electrons and holes in the intermediate layer 1104 provided between the EL layers are described. When voltage higher than the threshold voltage of the light-emitting element is applied between the anode 1101 and the cathode 1102, in the intermediate layer 1104, holes and electrons are generated, and the holes move into the EL layer which is provided on the cathode 1102 side and the electrons move into the EL layer which is provided on the anode 1101 side. The holes injected into the EL layer which is provided on the cathode side are recombined with the electrons injected from the cathode side, so that the light-emitting substance contained in the EL layer emits light. The electrons injected into the EL layer which is provided on the anode side are recombined with the holes injected from the anode side, so that the light-emitting substance contained in the EL layer emits light. Thus, the holes and electrons generated in the intermediate layer 1104 cause light emission in the respective EL layers.

Note that in the case where a structure which is the same as an intermediate layer is formed between the EL layers by providing the EL layers that are in contact with each other, the EL layers can be formed to be in contact with each other. Specifically, when a charge generation region is formed on one surface of the EL layer, the charge generation region functions as a first charge generation region of an intermediate layer; thus, the EL layers can be formed to be in contact with each other.

The structure examples 1 to 3 of the light-emitting element can be implemented in combination. For example, an intermediate layer may be provided between the cathode and the EL layer in the structure example 3 of the light-emitting element.

[Embodiment 4]

In this embodiment, a light-emitting device including a light-emitting element which includes a layer containing a light-emitting organic compound between an electrode containing a fusible alloy and an electrode which transmits visible light, where the electrode containing the fusible alloy is in contact with a layer containing an organic composition having thermal fusibility, and where the melting point of the fusible alloy is higher than the melting point of the organic composition having thermal fusibility and lower than temperature at which the layer containing a light-emitting organic compound is damaged, will be described with reference to FIGS. 7A and 7B and FIGS. 8A and 8B.

<Active Matrix Light-Emitting Device>

Figure 7A:
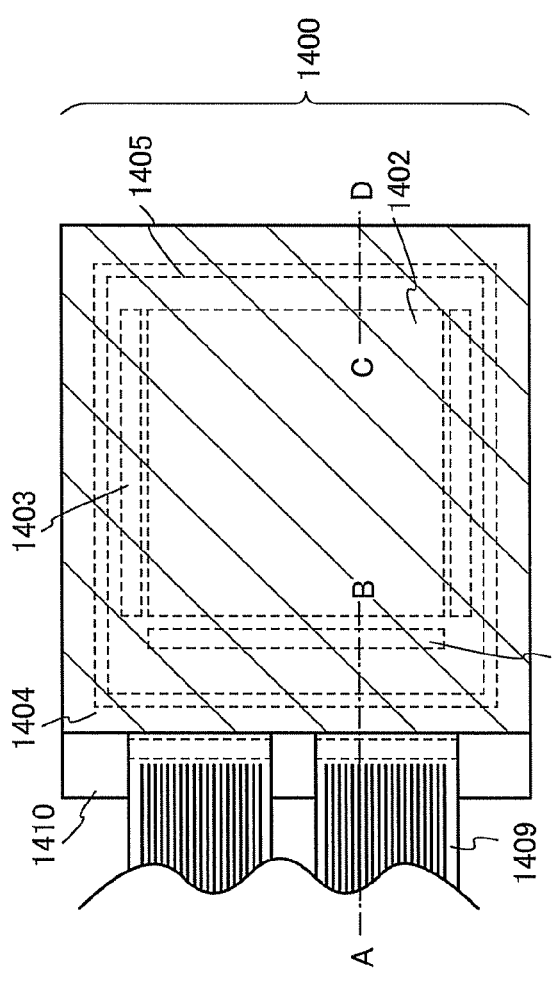
FIGS. 7A and 7B are views illustrating a structure of a light-emitting device according to one embodiment.
Figure 7B:
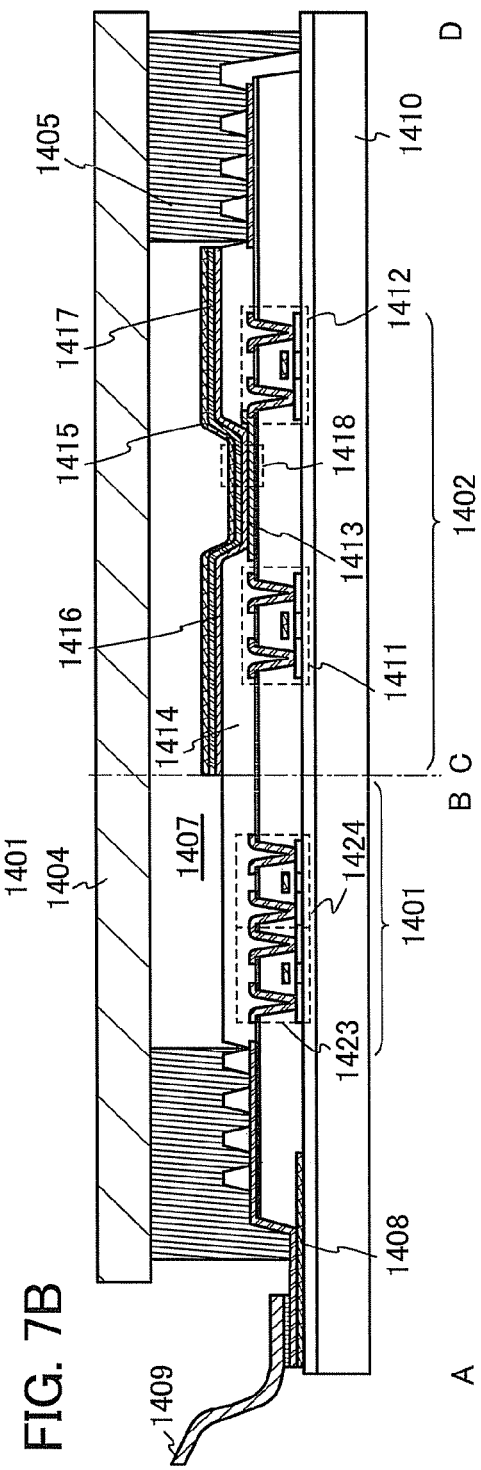

A structure in which the light-emitting element according to one embodiment of the present invention is applied to an active matrix light-emitting device is illustrated in FIGS. 7A and 7B. Note that FIG. 7A is a top view illustrating the light-emitting device, and FIG. 7B is a cross-sectional view taken along lines A-B and C-D of FIG. 7A.

An active matrix light-emitting device 1400 includes a driver circuit portion (a source side driver circuit) 1401, a pixel portion 1402, a driver circuit portion (a gate side driver circuit) 1403, a sealing substrate 1404, and a sealing member 1405 (see FIG. 7A). Note that a portion enclosed by the sealing member 1405 is a space.

The light-emitting device 1400 receives a video signal, a clock signal, a start signal, a reset signal, and the like from an FPC (flexible printed circuit) 1409 that is an external input terminal. Note that only the FPC is illustrated here; however, the FPC may be provided with a printed wiring board (PWB). The light-emitting device in this specification includes, in its category, not only the light-emitting device itself but also the light-emitting device provided with the FPC or the PWB.

Next, a structure of the light-emitting device 1400 will be described with reference to the cross-sectional view of FIG. 7B. The light-emitting device 1400 includes a driver circuit portion including the source side driver circuit 1401 illustrated over an element substrate 1410 and the pixel portion 1402 including a pixel illustrated. Further, it includes a lead wiring 1408 for transmitting signals that are to be inputted to the source side driver circuit 1401 and the gate side driver circuit 1403.

Note that in this embodiment, the source side driver circuit 1401 includes a CMOS circuit in which an n-channel TFT 1423 and a p-channel TFT 1424 are combined; however, the driver circuit is not limited to this structure, and the driver circuit may be any of a variety of circuits, such as a CMOS circuit, a PMOS circuit, or an NMOS circuit. Although this embodiment illustrates a driver-integrated type where the driver circuit is formed over the substrate, the present invention is not limited to this, and the driver circuit may be formed outside the substrate, not over the substrate.

The pixel portion 1402 includes a plurality of pixels having a switching TFT 1411, a current control TFT 1412, and a first electrode 1413 electrically connected to a drain of the current control TFT 1412. Note that a partition wall 1414 is formed so as to cover an end portion of the first electrode 1413. Here, the partition wall 1414 is formed using a positive type photosensitive acrylic resin film.

Further, the partition wall 1414 is provided such that either an upper end portion or a lower end portion of the partition wall 1414 has a curved surface with a curvature. For example, in the case of using positive photosensitive acrylic as a material for the partition wall 1414, it is preferable that the partition wall 1414 be formed so as to have a curved surface with radius of curvature (0.2 μm to 3 μm) only at the upper end portion thereof. The partition wall 1414 can be formed using either a negative type photosensitive resin which becomes insoluble in an etchant by light irradiation or a positive type photosensitive resin which becomes soluble in an etchant by light irradiation.

The light-emitting device 1400 includes a second electrode 1417 provided over the first electrode 1413 and a light-emitting layer 1416 between the first electrode 1413 and the second electrode 1417. Further, a layer 1415 containing an organic composition having thermal fusibility is provided in contact with the second electrode 1417 and is included in a light-emitting element 1418. As a structure of the light-emitting element 1418, a structure exemplified in Embodiment 1 can be employed, for example.

The light-emitting device 1400 exemplified in this embodiment has a structure in which the light-emitting element 1418 is sealed in a space 1407 enclosed by the element substrate 1410, the sealing substrate 1404, and the sealing member 1405. Note that the space 1407 is filled with a filler. There are cases where the space 1407 may be filled with an inert gas (such as nitrogen or argon), or where the space 1407 may be filled with the sealing member 1405. Further, a material for adsorbing an impurity, such as a desiccant, may be provided.

The sealing member 1405 and the sealing substrate 1404 are desirably formed using a material which does not transmit an impurity in the air (e.g. moisture or oxygen) as much as possible. As the sealing substrate 1404, in addition to a glass substrate or a quartz substrate, a plastic substrate formed using fiberglass-reinforced plastics (FRP), polyvinyl fluoride (PVF), polyester, acrylic, or the like can be given. As the sealing member 1405, typically, an epoxy-based resin is preferably used.

The active matrix light-emitting device according to one embodiment of the present invention has a structure using a light-emitting element which includes a layer containing a light-emitting organic compound between an electrode containing a fusible alloy and an electrode which transmits visible light, where the electrode containing the fusible alloy is in contact with a layer containing an organic composition having thermal fusibility, and where the melting point of the fusible alloy is higher than the melting point of the organic composition having thermal fusibility and lower than temperature at which the layer containing a light-emitting organic compound is damaged. Thus, a light-emitting device in which power is not consumed wastefully even if a short-circuit failure occurs can be provided.

<Passive Matrix Light-Emitting Device>

Figure 8A:
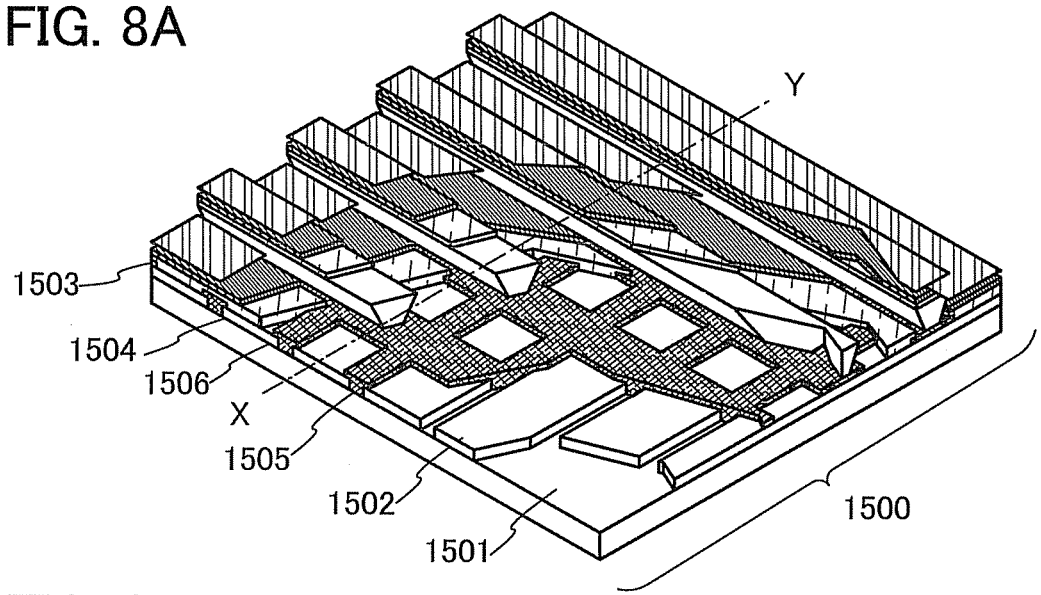
FIGS. 8A and 8B are views illustrating a structure of a light-emitting device according to one embodiment.
Figure 8B:
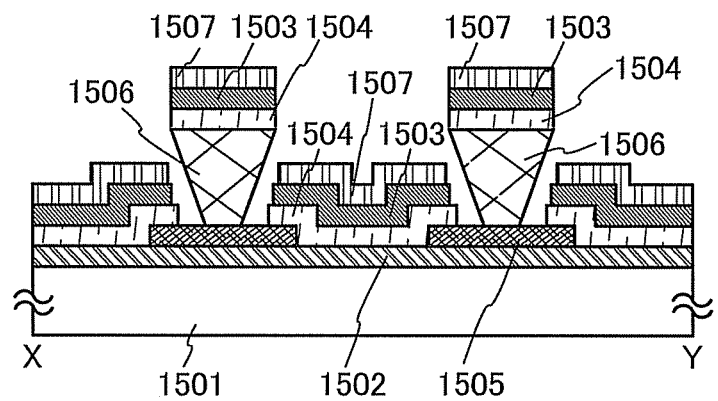

Next, a structure in which the light-emitting element according to one embodiment of the present invention is applied to a passive matrix light-emitting device is illustrated in FIGS. 8A and 8B. Note that FIG. 8A is a perspective view of the light-emitting device and FIG. 8B is a cross-sectional view taken along line X-Y of FIG. 8A.

A passive matrix light-emitting device 1500 includes a first electrode 1502 over a substrate 1501. Further, an insulating layer 1505 is provided so as to cover an end portion of the first electrode 1502, and a partition wall layer 1506 is provided over the insulating layer 1505.

The light-emitting device 1500 includes a second electrode 1503 provided over the first electrode 1502 and a light-emitting layer 1504 between the first electrode 1502 and the second electrode 1503. Further, a layer 1507 containing an organic composition having thermal fusibility is provided in contact with the second electrode 1503 and is included in the light-emitting element. As a structure of the light-emitting element, for example, a structure exemplified in Embodiment 1 can be employed. Note that the layer 1507 containing the organic composition having thermal fusibility exemplified in this embodiment is formed in such a manner that the organic composition having thermal fusibility which exhibits fluidity by being heated is sprayed on the second electrode 1503 by an ink-jet method. The organic composition having thermal fusibility, the surface tension of which is smaller than that of the second electrode 1503, can cover the surface of the second electrode 1503 without interruption.

The sidewalls of the partition wall layer 1506 slope so that a distance between both the sidewalls is gradually narrowed toward the surface of the substrate. In other words, a cross section of the partition wall layer 1506 in the direction of a narrow side is trapezoidal, and a base (a side facing in the same direction as a plane direction of the insulating layer 1505 and in contact with the insulating layer 1505) is shorter than an upper side (a side facing in the same direction as the plane direction of the insulating layer 1505 and not in contact with the insulating layer 1505). By provision of the partition wall layer 1506 in such a way, a defect of a light-emitting element due to crosstalk or the like can be prevented.

The passive matrix light-emitting device according to one embodiment of the present invention has a structure using a light-emitting element which includes a layer containing a light-emitting organic compound between an electrode containing a fusible alloy and an electrode which transmits visible light, where the electrode containing the fusible alloy is in contact with a layer containing an organic composition having thermal fusibility, and where the melting point of the fusible alloy is higher than the melting point of the organic composition having thermal fusibility and lower than temperature at which the layer containing a light-emitting organic compound is damaged. Thus, a light-emitting device in which power is not consumed wastefully even if a short-circuit failure occurs can be provided.

Note that this embodiment can be combined with any of the other embodiments in this specification as appropriate.

[Embodiment 5]

In this embodiment, an example of a light-emitting device in which a light-emitting element according to one embodiment of the present invention is incorporated will be described with reference to FIGS. 9A to 9E. Specifically, a light-emitting device (an electronic device) used for lighting will be described.

Examples of electronic devices to which the light-emitting device is applied are television devices (also referred to as TV or television receivers), monitors for computers and the like, cameras such as digital cameras and digital video cameras, digital photo frames, cellular phones (also referred to as portable telephone devices), portable game machines, portable information terminals, audio playback devices, large game machines such as pin-ball machines, and the like. Specific examples of these electronic devices are illustrated in FIGS. 9A to 9E.

Figure 9A:
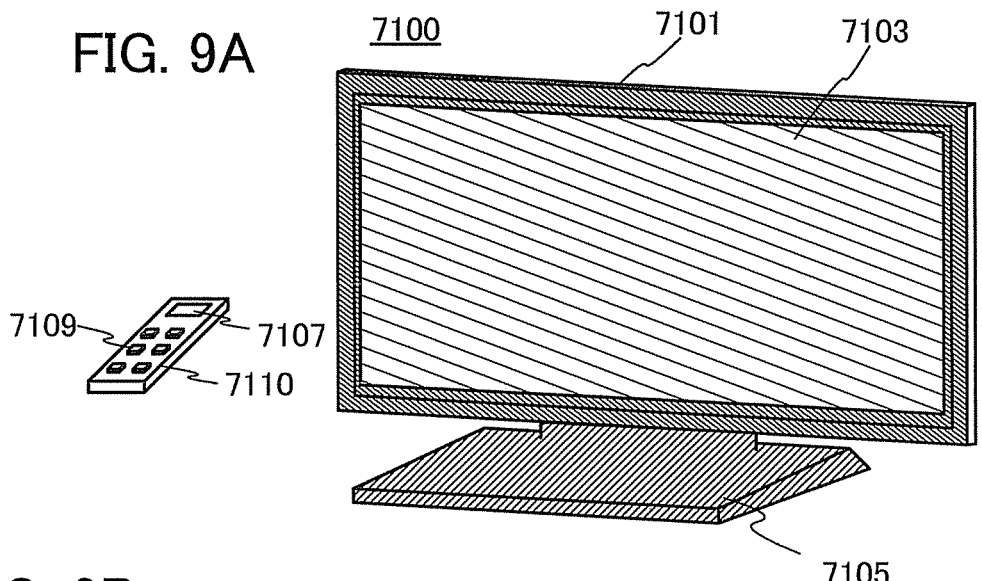
FIGS. 9A to 9E are views each illustrating an electronic device according to one embodiment.

FIG. 9A illustrates an example of a television device. In a television device 7100, a display portion 7103 is incorporated in a housing 7101. The display portion 7103 is capable of displaying images, and a light-emitting device can be used for the display portion 7103. In addition, here, the housing 7101 is supported by a stand 7105.

The television device 7100 can be operated with an operation switch provided in the housing 7101 or a separate remote controller 7110. With operation keys 7109 of the remote controller 7110, channels and volume can be controlled and images displayed on the display portion 7103 can be controlled. Furthermore, the remote controller 7110 may be provided with a display portion 7107 for displaying data to be output from the remote controller 7110.

Note that the television device 7100 is provided with a receiver, a modem, and the like. With the receiver, general television broadcasting can be received. Furthermore, when the television device 7100 is connected to a communication network by wired or wireless connection via the modem, one-way (from a transmitter to a receiver) or two-way (between a transmitter and a receiver, between receivers, or the like) data communication can be performed.

Figure 9B:
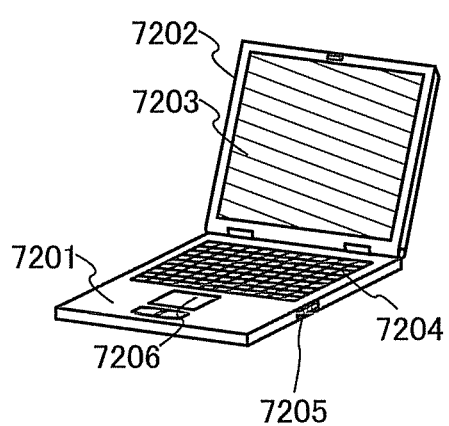

FIG. 9B illustrates a computer, which includes a main body 7201, a housing 7202, a display portion 7203, a keyboard 7204, an external connection port 7205, a pointing device 7206, and the like. Note that this computer is manufactured by using a light-emitting device for the display portion 7203.

Figure 9C:
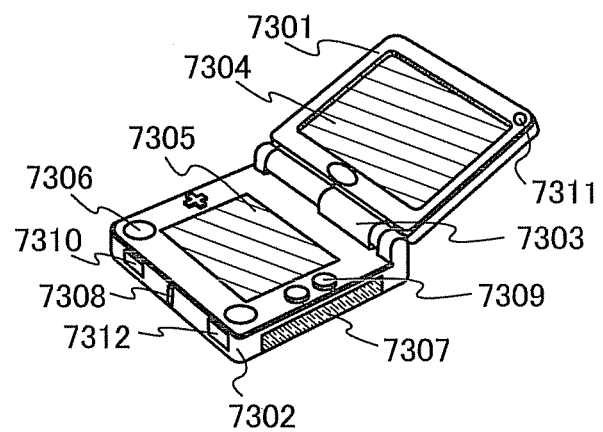

FIG. 9C illustrates a portable game machine, which includes two housings, i.e., a housing 7301 and a housing 7302, connected to each other via a joint portion 7303 so that the portable game machine can be opened or closed. A display portion 7304 is incorporated in the housing 7301 and a display portion 7305 is incorporated in the housing 7302. In addition, the portable game machine illustrated in FIG. 9C includes a speaker portion 7306, a recording medium insertion portion 7307, an LED lamp 7308, input means (an operation key 7309, a connection terminal 7310, a sensor 7311 (a sensor having a function of measuring force, displacement, position, speed, acceleration, angular velocity, rotational frequency, distance, light, liquid, magnetism, temperature, chemical substance, sound, time, hardness, electric field, electric current, voltage, electric power, radiation, flow rate, humidity, gradient, oscillation, odor, or infrared rays), and a microphone 7312), and the like. It is needless to say that the structure of the portable game machine is not limited to the above structure as long as a light-emitting device is used for at least either the display portion 7304 or the display portion 7305, or both, and may include other accessories as appropriate. The portable game machine illustrated in FIG. 9C has a function of reading out, a program or data stored in a storage medium to display it on the display portion, and a function of sharing information with another portable game machine by wireless communication. Note that the portable game machine illustrated in FIG. 9C can have a variety of functions without limitation to those above.

Figure 9D:
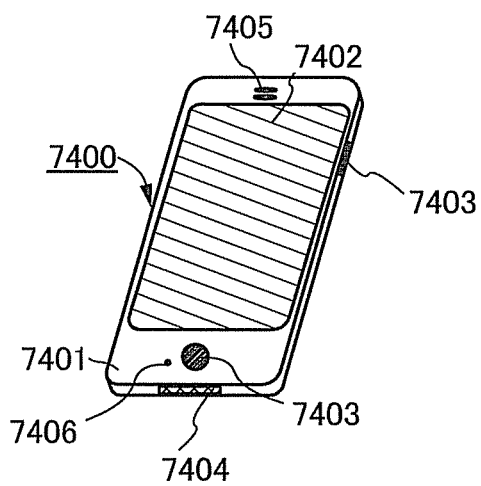

FIG. 9D illustrates an example of a cellular phone. A cellular phone 7400 is provided with a display portion 7402 incorporated in a housing 7401, operation buttons 7403, an external connection port 7404, a speaker 7405, a microphone 7406, and the like. Note that the cellular phone 7400 is manufactured by using a light-emitting device for the display portion 7402.

When the display portion 7402 of the cellular phone 7400 illustrated in FIG. 9D is touched with a finger or the like, data can be input to the cellular phone 7400. Further, operations such as making a call and creating e-mail can be performed by touch on the display portion 7402 with a finger or the like.

There are mainly three screen modes for the display portion 7402. The first mode is a display mode mainly for displaying an image. The second mode is an input mode mainly for inputting information such as characters. The third mode is a display-and-input mode in which two modes of the display mode and the input mode are mixed.

For example, in the case of making a call or creating e-mail, a character input mode mainly for inputting characters is selected for the display portion 7402 so that characters displayed on the screen can be input. In this case, it is preferable to display a keyboard or number buttons on almost the entire screen of the display portion 7402.

When a detection device including a sensor for detecting inclination, such as a gyroscope or an acceleration sensor, is provided inside the cellular phone 7400, display on the screen of the display portion 7402 can be automatically changed by determining the orientation of the cellular phone 7400 (whether the cellular phone is placed horizontally or vertically for a landscape mode or a portrait mode).

The screen modes are changed by touch on the display portion 7402 or operation with the operation buttons 7403 of the housing 7401. Alternatively, the screen modes can be changed depending on the kind of image displayed on the display portion 7402. For example, when a signal for an image to be displayed on the display portion is data of moving images, the screen mode is changed to the display mode. When the signal is text data, the screen mode is changed to the input mode.

Moreover, in the input mode, if a signal detected by an optical sensor in the display portion 7402 is detected and the input by touch on the display portion 7402 is not performed for a certain period, the screen mode may be controlled so as to be changed from the input mode to the display mode.

The display portion 7402 may function as an image sensor. For example, an image of a palm print, a fingerprint, or the like is taken by touch on the display portion 7402 with the palm or the finger, whereby personal identification can be performed. Furthermore, when a backlight or a sensing light source which emits near-infrared light is provided for the display portion, an image of a finger vein, a palm vein, or the like can also be taken.

Figure 9E:
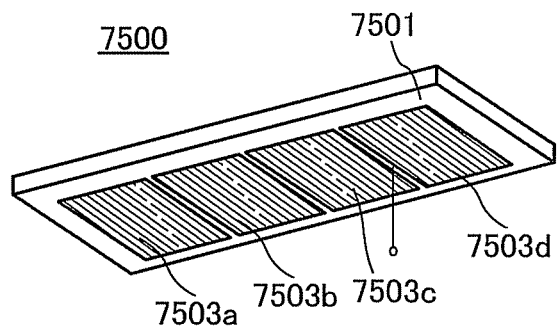

FIG. 9E illustrates an example of a lighting device. In a lighting device 7500, light-emitting devices 7503*a* to 7503*d* of one embodiment of the present invention are incorporated in a housing 7501 as light sources. The lighting device 7500 can be attached to a ceiling, a wall, or the like.

The light-emitting device of one embodiment of the present invention includes a light-emitting element in a thin film form. Thus, when the light-emitting device is attached to a base with a curved surface, the light-emitting device with a curved surface can be obtained. In addition, when the light-emitting device is located in a housing with a curved surface, an electronic device or a lighting device with a curved surface can be obtained.

A light-emitting device according to one embodiment of the present invention has a structure using a light-emitting element which includes a layer containing a light-emitting organic compound between an electrode containing a fusible alloy and an electrode which transmits visible light, where the electrode containing the fusible alloy is in contact with a layer containing an organic composition having thermal fusibility, and where the melting point of the fusible alloy is higher than the melting point of the organic composition having thermal fusibility and lower than temperature at which the layer containing a light-emitting organic compound is damaged. Thus, a light-emitting device in which power is not consumed wastefully even if a short-circuit failure occurs can be provided.

Note that this embodiment can be combined with any of the other embodiments in this specification as appropriate.

[Embodiment 6]

In this embodiment, an example of a light-emitting device in which a light-emitting element according to one embodiment of the present invention is incorporated will be described with reference to FIGS. 10A and 10B. Specifically, a light-emitting device (a lighting device or a lighting equipment) used for lighting will be described.

According to one embodiment of the present invention, a lighting device in which a light-emitting portion has a curved surface can be also realized.

One embodiment of the present invention can also be applied to lighting in a car; for example, lighting can be easily mounted on a dashboard, a ceiling, or the like.

Figure 10A:
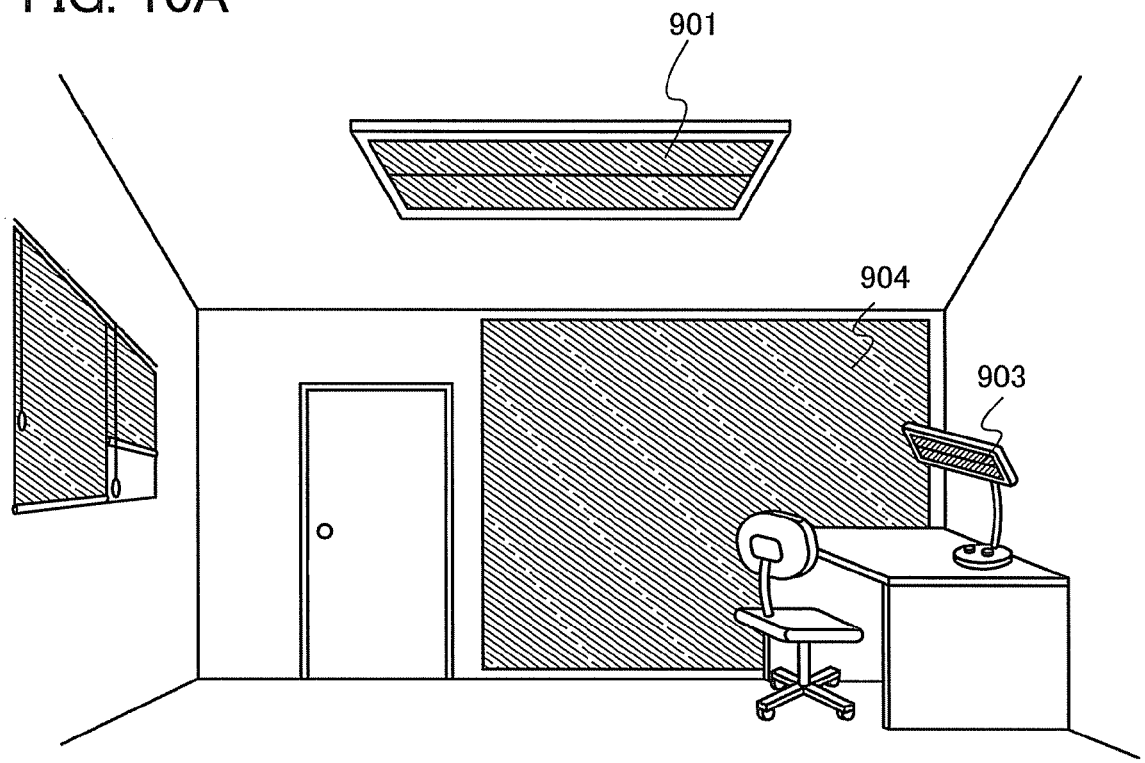
FIGS. 10A and 10B are views each illustrating a lighting device according to one embodiment.

FIG. 10A illustrates an interior lighting device 901 provided on a ceiling, a lighting device 904 provided on a wall surface, and a desk lamp 903 to which one embodiment of the present invention is applied. Since the light-emitting device can have a larger area, it can be used as a lighting device having a large area.

Figure 10B:
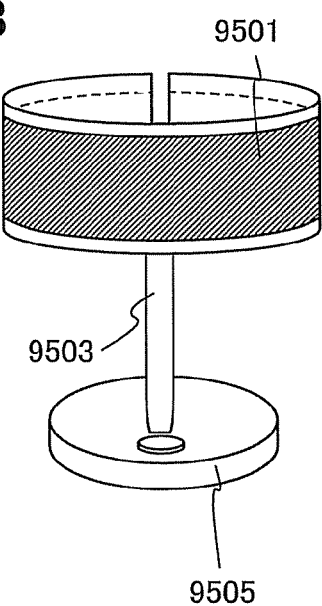

FIG. 10B illustrates an example of another lighting device. A desk lamp illustrated in FIG. 10B includes a lighting portion 9501, a support 9503, a support base 9505, and the like. The lighting portion 9501 includes a light-emitting device according to one embodiment of the present invention. According to one embodiment of the present invention, a lighting device having a curved surface can be realized.

The light-emitting device according to one embodiment of the present invention has a structure using a light-emitting element which includes a layer containing a light-emitting organic compound between an electrode containing a fusible alloy and an electrode which transmits visible light, where the electrode containing the fusible alloy is in contact with a layer containing an organic composition having thermal fusibility, and where the melting point of the fusible alloy is higher than the melting point of the organic composition having thermal fusibility and lower than temperature at which the layer containing a light-emitting organic compound is damaged. Thus, a light-emitting device in which power is not consumed wastefully even if a short-circuit failure occurs can be provided.

This embodiment can be freely combined with any of the other embodiments.

This application is based on Japanese Patent Application serial no. 2011-049386 filed with the Japan Patent Office on Mar. 7, 2011, the entire contents of which are hereby incorporated by reference.

What is claimed is:

1. A light-emitting element comprising:
a first electrode which transmits visible light;
a layer comprising a light-emitting organic compound over the first electrode;
a second electrode comprising a fusible alloy over the layer, the second electrode having a hole; and an organic composition over and in contact with the second electrode and the layer, wherein the hole is filled with the organic composition.

2. The light-emitting element according to claim 1, wherein a melting point of the fusible alloy is higher than a melting point of the organic composition, and lower than temperature at which the layer is damaged.

3. The light-emitting element according to claim 1, wherein a melting point of the fusible alloy is lower than or equal to 200° C., and a melting point of the organic composition is higher than or equal to 100° C.

4. The light-emitting element according to claim 1,
wherein the fusible alloy comprises one selected from bismuth (Bi), indium (In), lead (Pb),
wherein a melting point of the fusible alloy is higher than 100° C. and lower than or equal to 200° C.

5. The light-emitting element according to claim 1, wherein the organic composition comprises one selected from rosin, wax, and a resin.

6. The light-emitting element according to claim 1, wherein a charge generation layer is provided between the layer and the second electrode.

7. A light-emitting device comprising the light-emitting element according to claim 1.

8. A lighting device comprising the light-emitting element according to claim 1.

* * * * *

UNITED STATES PATENT AND TRADEMARK OFFICE
CERTIFICATE OF CORRECTION

PATENT NO. : 8,866,171 B2
APPLICATION NO. : 13/412851
DATED : October 21, 2014
INVENTOR(S) : Yasuo Nakamura et al.

It is certified that error appears in the above-identified patent and that said Letters Patent is hereby corrected as shown below:

In the Specification:

Column 6, Line 34; Change "thermal" to --terminal--.

Column 9, Line 11; Change "which" to --Which--.

Column 10, Line 9; Change "containing, the" to --containing the--.

Column 13, Line 26; Change "theimal" to --thermal--.

Column 14, Line 48; Change "fainted" to --formed--.

Column 15, Line 60; Change "fowled" to --formed--.

Column 17, Line 7; Change "faulted" to --formed--.

Column 19, Line 62 thru 63; Change "generatiOn" to --generation--.

Column 24, Line 60; Change "out, a" to --out a--.

Column 26, Line 56; Change "on. Japanese" to --on Japanese--.

In the Claims:

Column 27, Lines 14 thru 15; Claim 4; Change "lead (Pb), wherein"
to --lead (Pb), tin(Sn), and zinc (Zn), and wherein--.

Signed and Sealed this
Seventeenth Day of March, 2015

Michelle K. Lee
*Director of the United States Patent and Trademark Office*